United States Patent
Matsuzaki et al.

(10) Patent No.: US 10,051,159 B2
(45) Date of Patent: Aug. 14, 2018

(54) IMAGING APPARATUS AND IMAGING SYSTEM

(71) Applicant: Panasonic Intellectual Property Management Co., Ltd., Osaka (JP)

(72) Inventors: Keiichi Matsuzaki, Kyoto (JP); Michihiro Yamagata, Osaka (JP); Norihiro Imamura, Osaka (JP); Kenji Narumi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 196 days.

(21) Appl. No.: 14/805,011

(22) Filed: Jul. 21, 2015

(65) Prior Publication Data
US 2016/0037022 A1    Feb. 4, 2016

(30) Foreign Application Priority Data

Jul. 31, 2014  (JP) .................................. 2014-156020
Jul. 31, 2014  (JP) .................................. 2014-156724
(Continued)

(51) Int. Cl.
*H04N 5/225*  (2006.01)
*H04N 5/21*  (2006.01)
(Continued)

(52) U.S. Cl.
CPC .......... *H04N 5/211* (2013.01); *G02B 3/0056* (2013.01); *G02B 27/0018* (2013.01);
(Continued)

(58) Field of Classification Search
CPC ...... H04N 5/211; H04N 5/2254; H04N 5/332; G02B 3/0056; G02B 27/0018
(Continued)

(56) References Cited

U.S. PATENT DOCUMENTS 5,563,706 A * 10/1996  Shibuya ............. G01B 9/02039
                                                          356/495
7,242,478 B1    7/2007  Dombrowski et al.
(Continued)

FOREIGN PATENT DOCUMENTS

JP    2001-042230    2/2001
JP    2003-098426    4/2003
(Continued)

*Primary Examiner* — Sinh Tran
*Assistant Examiner* — Zhenzhen Wu
(74) *Attorney, Agent, or Firm* — McDermott Will & Emery LLP

(57) ABSTRACT

An imaging apparatus comprises a lens optical system including a lens and having first through nth optical regions (n is an integer equal to or greater than 2), an image sensor including pixel groups each including first through nth pixels, an optical element array disposed between the lens optical system and the image sensor and including optical components each guiding light that has passed through the first through nth optical regions to the respective first through nth pixels in each of the pixel groups, and an optical absorption member on which light reflected by the imaging surface of the image sensor is incident. The optical absorptance of the optical absorption member is substantially uniform across the entire wavelength bands of light that passes through the first through nth optical regions and is substantially uniform across the entire optical absorption member.

23 Claims, 16 Drawing Sheets

(30) Foreign Application Priority Data

Jul. 31, 2014 (JP) ................................. 2014-156725
Feb. 19, 2015 (JP) ................................. 2015-030976

(51) Int. Cl.
*H04N 5/33* (2006.01)
*G02B 3/00* (2006.01)
*G02B 27/00* (2006.01)
*H01L 27/146* (2006.01)

(52) U.S. Cl.
CPC .......... H04N 5/2254 (2013.01); H04N 5/332 (2013.01); *H01L 27/14607* (2013.01); *H01L 27/14625* (2013.01)

(58) Field of Classification Search
USPC ........................................ 348/335, 337, 340
See application file for complete search history.

(56) References Cited

U.S. PATENT DOCUMENTS

| | | | |
|---|---|---|---|
| 7,433,042 B1 | 10/2008 | Cavanaugh et al. | |
| 8,228,417 B1* | 7/2012 | Georgiev | G03B 11/00 348/335 |
| 8,345,144 B1* | 1/2013 | Georgiev | G03B 11/00 348/335 |
| 2003/0002543 A1* | 1/2003 | Lee | G11B 5/584 372/9 |
| 2003/0123143 A1* | 7/2003 | Lesniak | G02B 27/28 359/352 |
| 2006/0045507 A1* | 3/2006 | Takamiya | G02B 7/34 396/111 |
| 2008/0089679 A1* | 4/2008 | Kim | G03B 9/14 396/507 |
| 2008/0187305 A1* | 8/2008 | Raskar | G02B 27/0075 396/268 |
| 2009/0021598 A1* | 1/2009 | McLean | G01J 3/02 348/222.1 |
| 2009/0027542 A1 | 1/2009 | Yamamoto et al. | |
| 2009/0316025 A1 | 12/2009 | Hirai | |
| 2010/0201834 A1* | 8/2010 | Maruyama | H01L 27/14627 348/222.1 |
| 2012/0182438 A1 | 7/2012 | Berkner et al. | |
| 2012/0268643 A1 | 10/2012 | Imamura | |
| 2013/0002930 A1* | 1/2013 | Uchida | G03B 11/00 348/335 |
| 2013/0027778 A1* | 1/2013 | Currie | G02B 5/205 359/580 |
| 2013/0070146 A1 | 3/2013 | Imamura | |
| 2013/0120564 A1 | 5/2013 | Imamura | |
| 2013/0235256 A1 | 9/2013 | Kodama | |
| 2013/0329042 A1 | 12/2013 | Murata et al. | |
| 2014/0055661 A1 | 2/2014 | Imamura et al. | |

FOREIGN PATENT DOCUMENTS

| | | |
|---|---|---|
| JP | 2005-283855 | 10/2005 |
| JP | 2005-352273 | 12/2005 |
| JP | 2007-295141 | 11/2007 |
| JP | 2008-026353 | 2/2008 |
| JP | 2009-021919 | 1/2009 |
| JP | 2010-026490 | 2/2010 |
| JP | 2012-150112 | 8/2012 |
| JP | 2012-235472 | 11/2012 |
| JP | 2012-247645 | 12/2012 |
| JP | 2013-046303 | 3/2013 |
| JP | 2013-076950 | 4/2013 |
| JP | 2013-205781 | 10/2013 |
| WO | 2012/017577 | 2/2012 |
| WO | 2012/066741 | 5/2012 |
| WO | 2012/120584 | 9/2012 |
| WO | 2012/143983 | 10/2012 |
| WO | 2012/147245 | 11/2012 |
| WO | 2013/114891 | 8/2013 |

* cited by examiner

IMAGING APPARATUS AND IMAGING SYSTEM

BACKGROUND

1. Technical Field

The present disclosure relates to imaging apparatuses, such as cameras, and imaging systems that include the imaging apparatuses.

2. Description of the Related Art

In recent years, image sensing cameras have been being researched and developed. For example, an image of an object is obtained by imaging under a plurality of imaging conditions, such as the polarization condition of light used in imaging and the wavelength of the light. The image is then analyzed and information on the object is obtained.

Examples of conventional image sensing cameras include a multiband camera, which can obtain a two-dimensional spectral image of an object through a single instance of imaging. Such a multiband camera is disclosed, for example, in U.S. Pat. No. 7,433,042 and Japanese Patent No. 5418392. In addition, Japanese Patent No. 5001471 discloses an imaging apparatus that includes a spectral filter array disposed at a position of an entrance pupil of an imaging optical system and a microlens array disposed in the vicinity of an image sensor. Light rays that have been dispersed by the spectral filter array are guided to different pixels by the microlens array, and thus a desired spectral image can be obtained.

Hereinafter, an exemplary configuration of a conventional multiband camera will be described.

The multiband camera disclosed in Japanese Patent No. 5418932 divides the wavelength range of light to be used to image an object into four or more mutually different wavelength bands and images the object in these wavelength bands. The multiband camera includes a band-pass filter array disposed at a position of a pupil of an optical system, a microlens array, a photoelectric conversion element constituted by a plurality of pixels that are arrayed two-dimensionally, and a measurement unit that measures the spectral intensity of a light beam from the object.

The band-pass filter array includes four or more band-pass filters that transmit light in respective four or more divided wavelength bands. The photoelectric conversion element is disposed around the focal point of the microlens array and at a position where the photoelectric conversion element is conjugate with the band-pass filter array or in the vicinity of such a position. Light beams that have passed through the band-pass filter array are then guided by the microlens array to the plurality of pixels that are arrayed two-dimensionally. The measurement unit measures the spectral intensity of the light beams from the object on the basis of signals outputted from the plurality of pixels corresponding to the respective band-pass filters in the band-pass filter array.

SUMMARY

In one general aspect, the techniques disclosed here feature an imaging apparatus that includes a lens optical system, an image sensor, an optical element array, and an optical absorption member. The lens optical system includes a lens and has optical regions, and the optical regions include first through nth optical regions, in which n is an integer equal to or greater than 2. The image sensor, on which light that has passed through the first through nth optical regions is incident, includes pixel groups and has an imaging surface that reflects a part of the light that has passed through the first through nth optical regions. The pixel groups each include n pixels of first through nth pixels. The optical element array, in which optical components are arrayed, is disposed between the lens optical system and the image sensor. The optical components each guide the light that has passed through the first through nth optical regions to the respective first through nth pixels in each of the pixel groups. The part of the light that has passed through the first through nth optical regions and has been reflected by the imaging surface is incident on the optical absorption member. An optical absorptance of the optical absorption member is substantially uniform across the entire wavelength bands of the light that passes through the first through nth optical regions and is substantially uniform across the entire optical absorption member.

According to an aspect of the present disclosure, an occurrence of ghost light can be suppressed.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
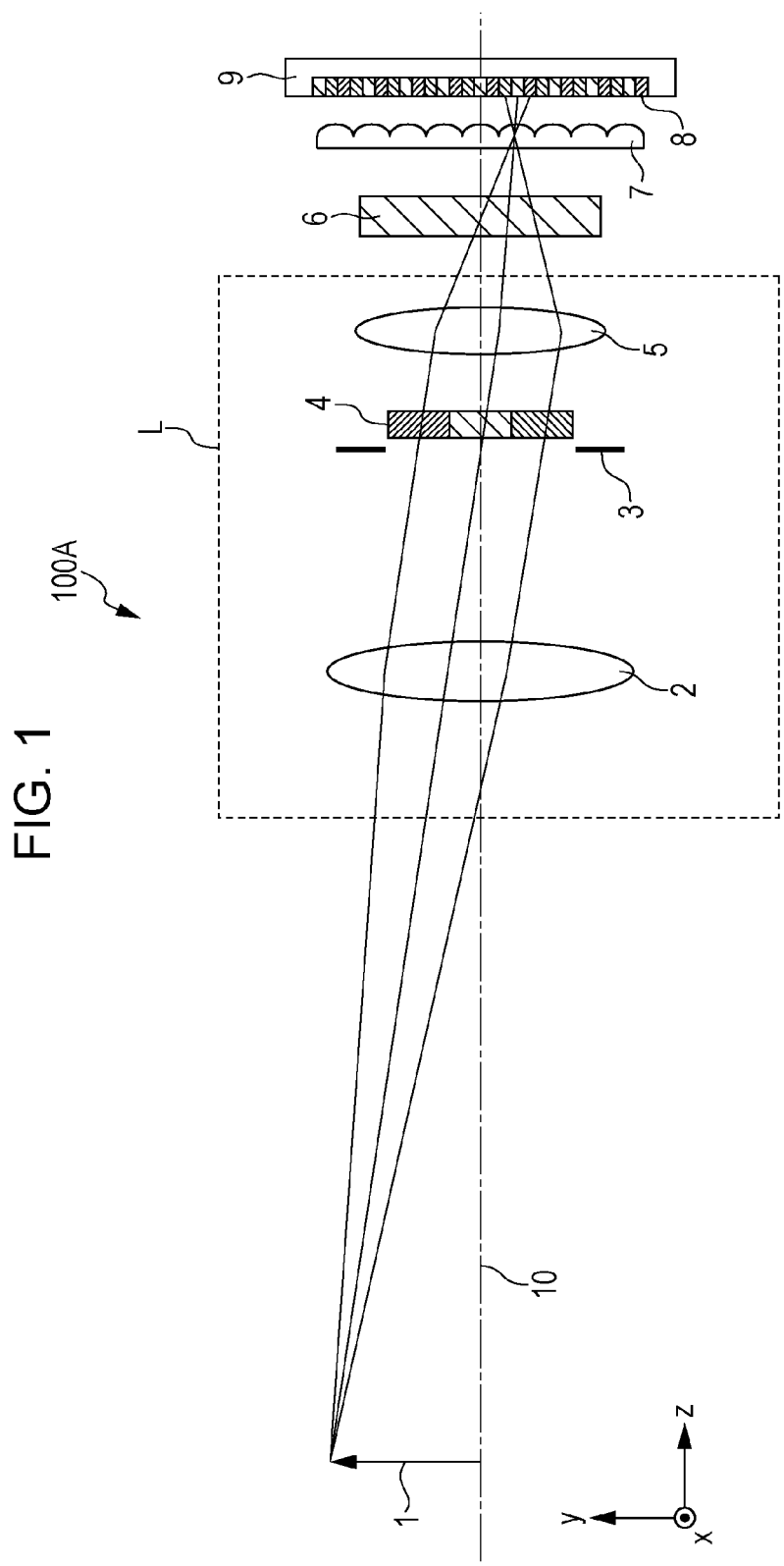
FIG. 1 is a schematic diagram illustrating an imaging apparatus according to a first exemplary embodiment.

For example, an absorptive color filter or an interference filter can be used as the band-pass filter described above. An absorptive color filter may be formed of a material having optical absorption characteristics with wavelength dependence. Meanwhile, an interference filter may be formed by an optical multilayer film.

The design flexibility of an interference filter is high in terms of the light utilization efficiency and spectral transmission characteristics. In addition, an interference filter advantageously functions as a narrow-band filter that transmits only light at a specific wavelength. Accordingly, an interference filter is used more frequently than an absorptive color filter as a band-pass filter for a multiband camera.

Hereinafter, a problem that the inventor of the present disclosure has considered will be described.

An interference filter transmits light in a predetermined wavelength band. Meanwhile, light in a wavelength band other than the wavelength band that the interference filter transmits is reflected with high reflectance by the interference filter. Due to such characteristics, disposing an interference filter in an optical path may be a significant cause for ghost light to be generated. Specifically, for example, light in a given wavelength band A passes through a band-pass filter a provided in a given region of a band-pass filter array. That light, however, is reflected with high reflectance by a band-pass filter b provided in another region.

In this manner, for the light in the wavelength band A, the band-pass filter b functions as a reflection mirror disposed in an optical path. As a result, ghost light is likely to be generated. For example, some of the light in the wavelength band A that has passed through a first band-pass filter and has reached a photoelectric conversion element through a microlens array is specularly reflected by the surface of the photoelectric conversion element. The reflected light, as returning light, reaches a second band-pass filter that is disposed in the band-pass filter array at a position that is rotationally symmetric to the first band-pass filter with respect to the center axis of the entrance pupil. The second band-pass filter transmits light in a wavelength band B. The returning light is thus reflected again by the second band-pass filter and is then incident on the photoelectric conversion element. In this manner, the returning light becomes ghost light and a ghost image appears. In the specification of the present disclosure, ghost light primarily refers to the above-described returning light. In addition, a ghost image refers to an image that appears due to the ghost light.

The returning light that is incident on the photoelectric conversion element is superposed on light that serves as a basis of two-dimensional spectral information of an object. As a result, the superposed light appears as a ghost image in the measurement result. The appearance of a ghost image is a fundamental problem of the multiband camera disclosed in U.S. Pat. No. 7,433,042 or Japanese Patent No. 5418392. This problem, however, is not even mentioned in U.S. Pat. No. 7,433,042 or Japanese Patent No. 5418392. In addition, even in a case in which an optical function element, aside from the band-pass filter, having high reflectance is disposed at the position of the pupil, as in the case described above, a ghost image appears. Examples of optical function elements having high reflectance include a wire-grid polarizer, which is a reflective polarizing element. It is to be noted that the mechanism by which a ghost image is generated will be described later in detail.

With the conventional techniques described above, it is desired that an occurrence of ghost light be suppressed.

In view of such a problem with the conventional techniques, the inventor of the present disclosure has conceived of an imaging apparatus that has a novel structure.

A non-limiting, exemplary embodiment of the present disclosure provides an imaging apparatus and an imaging system that can suppress an occurrence of ghost light.

The present disclosure includes an imaging apparatus and an imaging system set forth in the following items.

Item 1

A imaging apparatus that includes a lens optical system that includes a lens and has optical regions, the optical regions including first through nth optical regions, n being an integer equal to or greater than 2; an image sensor on which light that has passed through the first through nth optical regions is incident, the image sensor including pixel groups and having an imaging surface that reflects a part of the light that has passed through the first through nth optical regions, the pixel groups each including n pixels of first through nth pixels; an optical element array in which optical components are arrayed, the optical element array being disposed between the lens optical system and the image sensor, the optical components each guiding the light that has passed through the first through nth optical regions to the respective first through nth pixels in each of the pixel groups; and an optical absorption member on which the part of the light that has passed through the first through nth optical regions and has been reflected by the imaging surface is incident, wherein an optical absorptance of the optical absorption member is substantially uniform across the entire wavelength bands of the light that passes through the first through nth optical regions and is substantially uniform across the entire optical absorption member. In the lens optical system of the imaging apparatus set forth in Item 1, the plurality of optical regions may be disposed so as to be substantially perpendicular to an optical axis of the lens. In other words, the angle formed by the optical axis of the lens and the plurality of optical regions may be from 85° to 95° inclusive.

According to the imaging apparatus set forth in Item 1, ghost light can be suppressed effectively, and a high-precision image with little ghost image can be obtained.

Item 2

The imaging apparatus set forth in Item 1, wherein the optical absorption member is disposed between the optical regions and the image sensor and absorbs at least first light in a first wavelength band and second light in a second wavelength band, the first light being capable of passing through the first optical region, the second light being capable of passing through the second optical region.

According to the imaging apparatus set forth in Item 2, an imaging apparatus that can obtain a high-precision image with little image noise and little ghost image can be provided. For example, an imaging apparatus for high-precision image sensing can be provided.

Item 3

The imaging apparatus set forth in Item 2, wherein at least one selected from the group of the first and second optical regions has optical characteristics of transmitting visible light, and wherein the optical absorption member absorbs at least the visible light.

According to the imaging apparatus set forth in Item 3, an imaging apparatus that can obtain a high-precision image with little image noise and little ghost image in imaging in which visible light is used can be provided.

Item 4

The imaging apparatus set forth in Item 2 or 3, wherein the lens optical system further includes a stop, and wherein the optical regions are disposed at the stop or in the vicinity of the stop.

Item 5

The imaging apparatus set forth in any one of Items 2 through 4, wherein the first optical region differs from the second optical region in terms of at least one selected from the group of spectral transmittance characteristics and polarization characteristics.

According to the imaging apparatus set forth in Item 5, an imaging apparatus that can simultaneously capture images that differ in terms of at least one selected from the group of the spectral transmittance characteristics and the polarization characteristics through a single instance of imaging and that can also obtain a high-precision image with little image noise and little ghost image can be provided.

Item 6

The imaging apparatus set forth in any one of Items 1 through 5, wherein the optical absorptance of the optical absorption member is uniform across the entire wavelength bands of the light that passes through the first through nth optical regions, or a relative error in the optical absorptance in the entire wavelength bands is within 10%, and wherein the optical absorptance of the optical absorption member per unit area is uniform across the entire optical absorption member, or a relative error in the optical absorptance of the entire optical absorption member per unit area is within 10%.

According to the imaging apparatus set forth in Item 6, an imaging apparatus that can effectively suppress ghost light and that can obtain a high-precision image with little ghost image can be provided.

Item 7

The imaging apparatus set forth in any one of Items 2 through 4 further includes at least two narrow band-pass optical filters disposed in the optical regions, the at least two narrow band-pass optical filters differ in transmission wavelength bands.

According to the imaging apparatus set forth in Item 7, an imaging apparatus that can simultaneously capture narrow-band images that differ in terms of the spectral transmittance characteristics through a single instance of imaging and that can also obtain a high-precision image with little image noise and little ghost image can be provided.

Item 8

The imaging apparatus set forth in any one of Items 2 through 7, wherein the optical element array is a lenticular lens.

According to the imaging apparatus set forth in Item 8, light that has passed through the first and second optical regions can efficiently be guided one-dimensionally to the respective first and second pluralities of pixels.

Item 9

The imaging apparatus set forth in any one of Items 2 through 7, wherein the optical element array is a microlens array.

According to the imaging apparatus set forth in Item 9, light that has passed through the first and second optical regions can efficiently be guided two-dimensionally to the respective first and second pluralities of pixels.

Item 10

The imaging apparatus set forth in any one of Items 2 through 9, wherein the optical element array is integrated with the image sensor.

According to the imaging apparatus set forth in Item 10, it becomes unnecessary to adjust the positioning of the optical element array and the image sensor, and a change over time in the positional relation between the optical element array and the image sensor can be reduced.

Item 11

The imaging apparatus set forth in any one of Items 2 through 9 further includes a microlens provided between the optical element array and the image sensor, and wherein the optical element array is integrated with the microlens and the image sensor.

According to the imaging apparatus set forth in Item 11, the efficiency of light incident on the image sensor improves due to the microlens, and the S/N ratio of a video signal can be improved.

Item 12

The imaging apparatus set forth in any one of Items 2 through 9, wherein the optical absorption member is integrated with the image sensor.

According to the imaging apparatus set forth in Item 12, it becomes unnecessary to adjust the positioning of the optical absorption member and the image sensor, and a change over time in the positional relation between the optical absorption member and the image sensor can be reduced.

Item 13

The imaging apparatus set forth in any one of Items 2 through 12, wherein the optical absorption member is an absorptive neutral density (ND) filter, and a ratio of a quantity of emitted light that is emitted from the ND filter to a quantity of incident light that is incident on the ND filter is from 30% to 50% inclusive.

According to the imaging apparatus set forth in Item 13, an imaging apparatus that includes a commercially available ND filter and can obtain a high-precision image with little image noise and little ghost image can be provided.

Item 14

The imaging apparatus set forth in any one of Items 2 through 11, wherein the optical absorption member includes an absorptive linear polarizer that transmits vibrating light that vibrates in a direction of a polarization axis, and a phase plate that converts linearly polarized light to circularly polarized light or to elliptically polarized light, and wherein the absorptive linear polarizer is disposed in the optical absorption member toward a side of the optical regions, and the phase plate is disposed in the optical absorption member toward a side of the image sensor.

According to the imaging apparatus set forth in Item 14, an imaging apparatus that can obtain a high-precision image with little image noise and little ghost image can be provided.

Item 15

The imaging apparatus set forth in Item 14, wherein the phase plate is a quarter-wave plate.

According to the imaging apparatus set forth in Item 15, an imaging apparatus that includes a commercially available quarter-wave plate and can obtain a high-precision image with little image noise and little ghost image can be provided.

Item 16

The imaging apparatus set forth in Item 14, wherein the phase plate is an achromatic wave plate.

According to the imaging apparatus set forth in Item 16, an imaging apparatus that can obtain a high-precision image with little image noise and little ghost image even when an imaging wavelength band is broad can be provided.

Item 17

The imaging apparatus set forth in Item 2, wherein the first optical region has first spectral transmittance characteristics of transmitting a first near-infrared ray in the first wavelength band, and the second optical region has second spectral transmittance characteristics of transmitting a second near-infrared ray in the second wavelength band, the second wavelength band being different from the first wavelength band, and wherein the optical absorption member absorbs at least the first and second near-infrared rays.

According to the imaging apparatus set forth in Item 17, an imaging apparatus that can obtain a high-precision image with little image noise and little ghost image in imaging in which near-infrared rays are used can be provided.

Item 18

The imaging apparatus set forth in Item 2, wherein n is 9, wherein, in each of the pixel groups, the first pixel, the second pixel, the third pixel, the fourth pixel, the fifth pixel, the sixth pixel, the seventh pixel, the eighth pixel, and the ninth pixel are arrayed in a 3×3 matrix, wherein the pixel groups are repeated in a row direction and in a column direction in the image sensor, wherein the optical element array is a microlens array that includes microlenses, wherein each of the microlenses in the microlens array corresponds to one of the pixel groups, and wherein the optical absorption member absorbs at least the first light, the second light, third light in a third wavelength band, fourth light in a fourth wavelength band, fifth light in a fifth wavelength band, sixth light in a sixth wavelength band, seventh light in a seventh wavelength band, eighth light in an eighth wavelength band, and ninth light in a ninth wavelength band, the third light being capable of passing through the third optical region, the fourth light being capable of passing through the fourth optical region, the fifth light being capable of passing through the fifth optical region, the sixth light being capable of passing through the sixth optical region, the seventh light being capable of passing through the seventh optical region, the eighth light being capable of passing through the eighth optical region, and the ninth light being capable of passing through the ninth optical region.

According to the imaging apparatus set forth in Item 18, an imaging apparatus that can capture an image having multiple spectral characteristics through a single instance of imaging and that can also obtain a high-precision image with little image noise and little ghost image can be provided.

Item 19

An imaging apparatus includes a lens optical system; an image sensor that receives light condensed by the lens optical system; and an optical element disposed between the lens optical system and the image sensor, the optical element absorbing at least visible light, the optical element having substantially uniform optical absorption characteristics across the entire region of the optical element through which the light passes.

According to the imaging apparatus set forth in Item 19, an imaging apparatus that can obtain a high-precision image with little image noise and little ghost image can be provided.

Item 20

An imaging system includes an imaging apparatus set forth in any one of Items 1 through 19; a signal processor adapted to process a pixel signal outputted from the imaging apparatus to generate image information; and a display adapted to display an image corresponding to the image information.

According to the imaging system set forth in Item 20, an imaging system for image sensing that includes an imaging apparatus capable of obtaining a high-precision image with little image noise and little ghost image can be provided.

With an imaging apparatus according to an aspect of the present disclosure, for example, a plurality of images can be obtained simultaneously by a single imaging optical system under a plurality of imaging conditions, such as the polarization condition of light used in imaging and the wavelength of the light. In addition, a ghost image can be suppressed by the optical absorption member. As a result, an imaging apparatus that is capable of high-precision spectral imaging can be provided.

Hereinafter, specific embodiments of the present disclosure will be described with reference to the drawings. In the description to follow, identical or similar components are given identical reference characters. In addition, duplicate descriptions may be omitted. It is to be noted that an imaging apparatus and an imaging system according to embodiments of the present disclosure are not limited to those illustrated hereinafter.

First Embodiment

FIG. 1 is a schematic diagram illustrating an imaging apparatus 100A according to a first embodiment.

Hereinafter, the configuration of the imaging apparatus 100A will be described with the direction of an optical axis 10, which is the center axis of the imaging apparatus 100A, set as a z-axis and with a plane orthogonal to the z-axis set as an xy-plane, as illustrated in FIG. 1. It is to be noted that an object 1 is illustrated in FIG. 1 so as to facilitate understanding of a person skilled in the art. It is needless to say that the object 1 is not a component of the imaging apparatus 100A.

The imaging apparatus 100A includes a lens optical system L, an optical absorption member 6, an optical element array 7, and an image sensor 9.

The lens optical system L includes a first lens 2, a second lens 5, a stop 3, and a band-pass filter array 4. The first lens 2 condenses light from the object 1 and guides the light to the stop 3. The second lens 5 condenses light that has passed through the band-pass filter array 4. In the specification of the present disclosure, the stop 3 or a region in the vicinity of the stop 3 is referred to as an optical region.

The band-pass filter array 4 is disposed in the optical region along the xy-plane. The band-pass filter array 4 may be formed by a plurality of band-pass filters. The optical region includes at least a first optical region and a second optical region that have different optical characteristics.

The first lens 2 and the second lens 5 may each be constituted by a single lens or by a plurality of lenses. In addition, the configuration may be such that a plurality of lenses are disposed at front and back sides of the stop 3. If the range of the angle of view of imaging is narrow, the first lens 2 may be omitted.

The optical element array 7 is, for example, a microlens array. The optical element array 7 is disposed at or in the vicinity of a focal point of the lens optical system L and is disposed between the lens optical system L and the image sensor 9.

The image sensor 9 includes a plurality of pixels 8 disposed therein. The image sensor 9 includes at least a plurality of first pixels and a plurality of second pixels.

The optical element array 7 guides the light that has passed through the first optical region to the plurality of first pixels and guides the light that has passed through the second optical region to the plurality of second pixels.

The optical absorption member 6 is a member that may be formed of a material that absorbs light, and primarily absorbs reflected light from an imaging surface of the image sensor 9. Specifically, the optical absorption member 6 absorbs at least light in a first wavelength band (e.g., wavelength band of red), which is the wavelength band of the light that has passed through the first optical region, and light in a second wavelength band (e.g., wavelength band in blue), which is the wavelength band of the light that has passed through the second optical region. The optical absorption member 6 has substantially uniform optical absorption characteristics (i.e., optical absorptance) across a region therein through which light passes. In addition, the optical absorption member 6 has substantially the same optical absorptance in the wavelength bands of the light that passes through the first and second optical regions.

That the optical absorptance is substantially uniform across a region through which the light passes means that the optical absorptance per unit area is constant within the region through which the light passes or that a relative error in the optical absorptance per unit area is within 10% in the region through which the light passes. In addition, that the optical absorptance is substantially the same in the wavelength bands of light that passes through the first and second optical regions means that the optical absorptance is uniform across the entire wavelength bands of the light that passes through the first and second optical regions or that a relative error in the optical absorptance in the stated wavelength bands is within 10%.

The optical absorption member 6 is disposed between the lens optical system L and the optical element array 7. However, the configuration is not limited thereto, and the optical absorption member 6 may, for example, be disposed between the band-pass filter array 4 and the second lens 5. It is sufficient if the optical absorption member 6 is disposed between the band-pass filter array 4 and the image sensor 9.

Subsequently, with reference to FIG. 2, the configuration of the band-pass filter array 4 will be described in detail.

Figure 2:
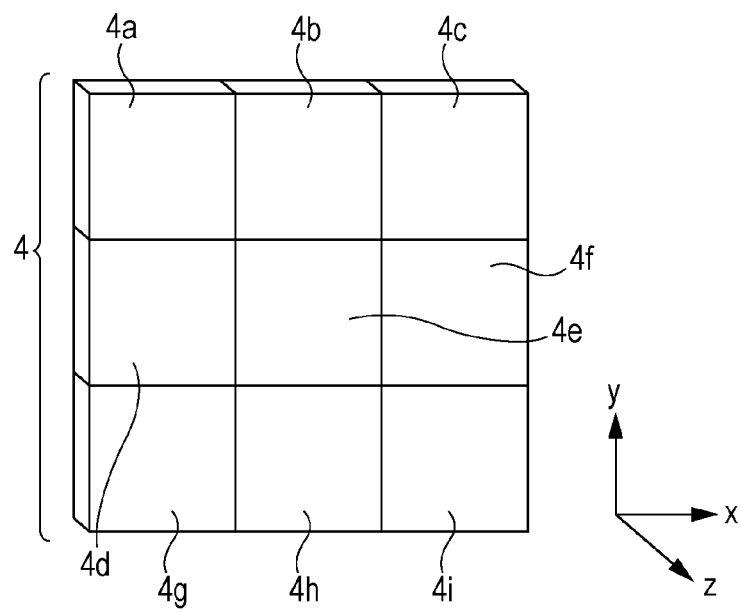
FIG. 2 is a perspective view of a band-pass filter array.

FIG. 2 is a perspective view of the band-pass filter array 4.

In the present embodiment, an example in which the optical region is divided into nine optical regions will be described. The number of optical regions into which the optical region is divided is not limited to nine and can be any integer that is equal to or greater than two.

The band-pass filter array 4 is disposed in the optical region in the vicinity of the stop 3. The band-pass filter array 4 is constituted by nine rectangular band-pass filters 4a through 4i. The rectangular band-pass filters 4a through 4i are disposed in a 3×3 matrix along the xy-plane. The rectangular band-pass filters 4a through 4i are disposed in the respective nine optical regions. The rectangular band-pass filters 4a through 4i have mutually different optical transmission wavelength bands.

For example, when the wavelength band to be used in imaging the object 1 is in a range of visible light wavelengths, namely, from 380 nm to 750 nm, transmission wavelength bands of equal widths can be assigned to the respective rectangular band-pass filters 4a through 4i. Specifically, a transmission wavelength band of 390 nm to 430 nm can be assigned to the rectangular band-pass filter 4a, and a transmission wavelength band of 430 nm to 470 nm can be assigned to the band-pass filter 4b. In a similar manner, a transmission wavelength band of 470 nm to 510 nm can be assigned to the band-pass filter 4c. A transmission wavelength band of 510 nm to 550 nm can be assigned to the band-pass filter 4d. A transmission wavelength band of 550 nm to 590 nm can be assigned to the band-pass filter 4e. A transmission wavelength band of 590 nm to 630 nm can be assigned to the band-pass filter 4f. A transmission wavelength band of 630 nm to 670 nm can be assigned to the band-pass filter 4g. A transmission wavelength band of 670 nm to 710 nm can be assigned to the band-pass filter 4h. A transmission wavelength band of 710 nm to 750 nm can be assigned to the band-pass filter 4i.

In the exemplary configuration illustrated in FIG. 2, the rectangular band-pass filters 4a through 4i are disposed so as to be adjacent to one another. However, due to diffraction or scattering at an edge of a boundary portion, crosstalk of light transmitted through the band-pass filters may occur. Therefore, light-blocking regions may be provided at boundary portions of the rectangular band-pass filters 4a through 4i so as to reduce the crosstalk.

Subsequently, with reference to FIG. 3, the configuration of the optical element array 7 and the image sensor 9 will be described in detail.

Figure 3:
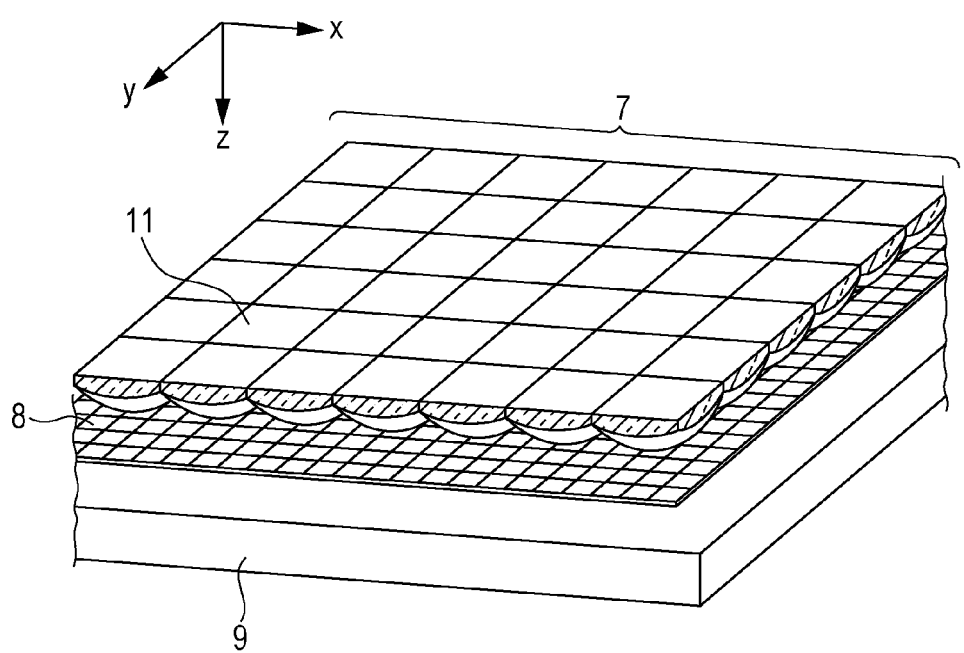
FIG. 3 is a perspective view illustrating an exemplary configuration of an optical element array and an image sensor.

FIG. 3 is a perspective view illustrating the configuration of the optical element array 7 and the image sensor 9. As illustrated in FIG. 3, in the present embodiment, the optical element array 7 is a microlens array. Microlenses 11 constituting the microlens array are disposed two-dimensionally in the x-direction and the y-direction in the vicinity of the surface of the image sensor 9.

Several tens of hundred to several million microlenses 11 are disposed along the xy-plane. The shape of each microlens 11 is, for example, a circle, a quadrangle, or a hexagon. The focal length of the microlenses 11 is approximately from several tens to several hundreds of micrometers.

The microlenses 11 are disposed in the vicinity of the focal point of the lens optical system L. The real image of the object 1 is formed on the microlenses 11. The plurality of pixels 8 are disposed in the vicinity of the focal point position of the microlenses 11.

The image sensor 9 is constituted by several hundreds of thousand to several tens of million pixels 8, which are photoelectric conversion elements, disposed along the xy-plane. The image sensor 9, for example, is a charge-coupled device (CCD) image sensor or a complementary metal-oxide semiconductor (CMOS) image sensor.

Figure 4:
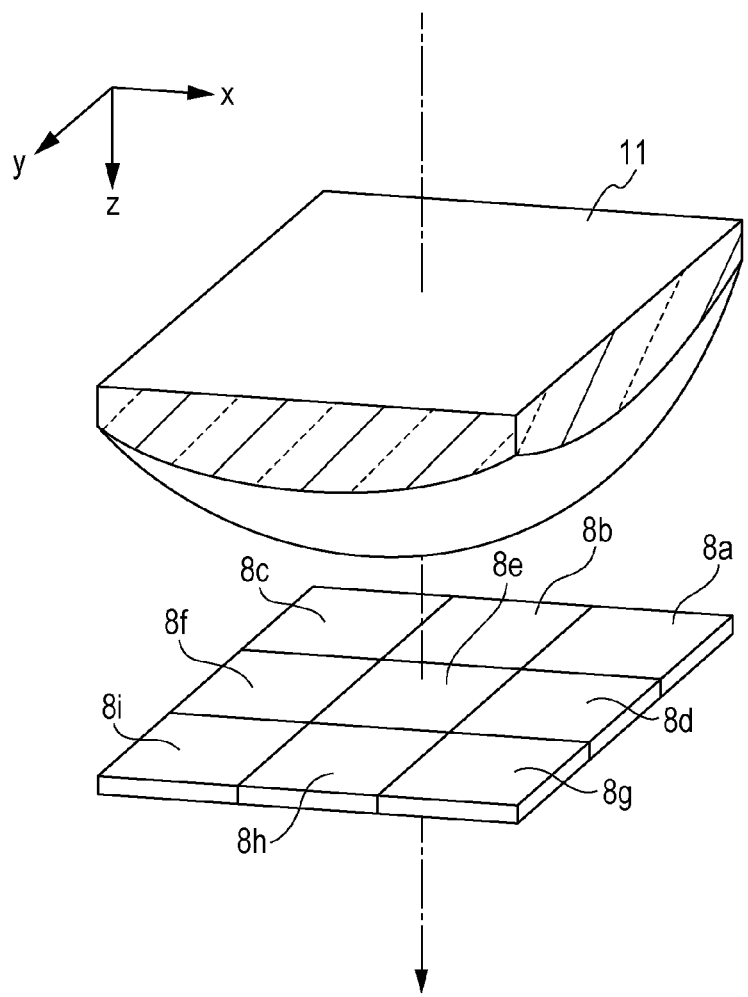
FIG. 4 is a perspective view for describing a relation between a given microlens in an optical element array and a plurality of pixels corresponding to the given microlens.

FIG. 4 is a perspective view for describing a relation between a given microlens 11 in the optical element array 7 (microlens array) and a plurality of pixels 8 corresponding to the given microlens 11.

A single microlens 11 corresponds to nine pixels 8a through 8i. Information for one pixel in each of a plurality of images captured simultaneously is obtained by a configuration unit illustrated in FIG. 4.

The microlens 11 is formed with parameters, such as the refractive index, the distance from an imaging surface, and the radius of curvature, being set as appropriate. Light that has passed through the nine optical regions of the band-pass filters 4a through 4i illustrated in FIG. 2 is divided by the microlenses 11, and the light rays are discretely incident on the respective nine pixels 8a through 8i. It is to be noted that the number of pixels corresponding to a single microlens 11 varies in accordance with the number of divided optical regions.

Each of the plurality of pixels 8 converts light incident thereon into a pixel signal corresponding to the intensity of the light through photoelectric conversion. A luminance signal of an image to be obtained is based on this pixel signal. A signal processor (not illustrated) receives pixel signals, outputted from the image sensor 9, corresponding to the respective pixels 8. The signal processor obtains luminance information of a pixel group corresponding to the pixel 8a, illustrated in FIG. 4, in each of the microlenses 11 of the optical element array 7. The signal processor generates information on a two-dimensional image in the first wavelength band from the obtained luminance information of the pixel group. The signal processor carries out similar processes for the pixel groups corresponding to the respective pixels 8b through 8i illustrated in FIG. 4. The signal processor outputs the two-dimensional image information in nine different wavelength bands. In this manner, by using the imaging apparatus 100A, a plurality of images that are based on information of light in different wavelength bands can be obtained simultaneously.

The signal processor may be constituted by hardware, such as a semiconductor element. The signal processor may typically be implemented by an image signal processor (ISP). The signal processor may also be implemented by an arithmetic unit (e.g., microprocessor unit (MPU)), a memory, and software.

It is to be noted that light-blocking regions or blind sectors may be provided, for example, at boundary portions of the pixels 8a through 8i so that signal light from the microlens 11 is not incident on surrounding pixels other than a predetermined pixel.

Figure 5:
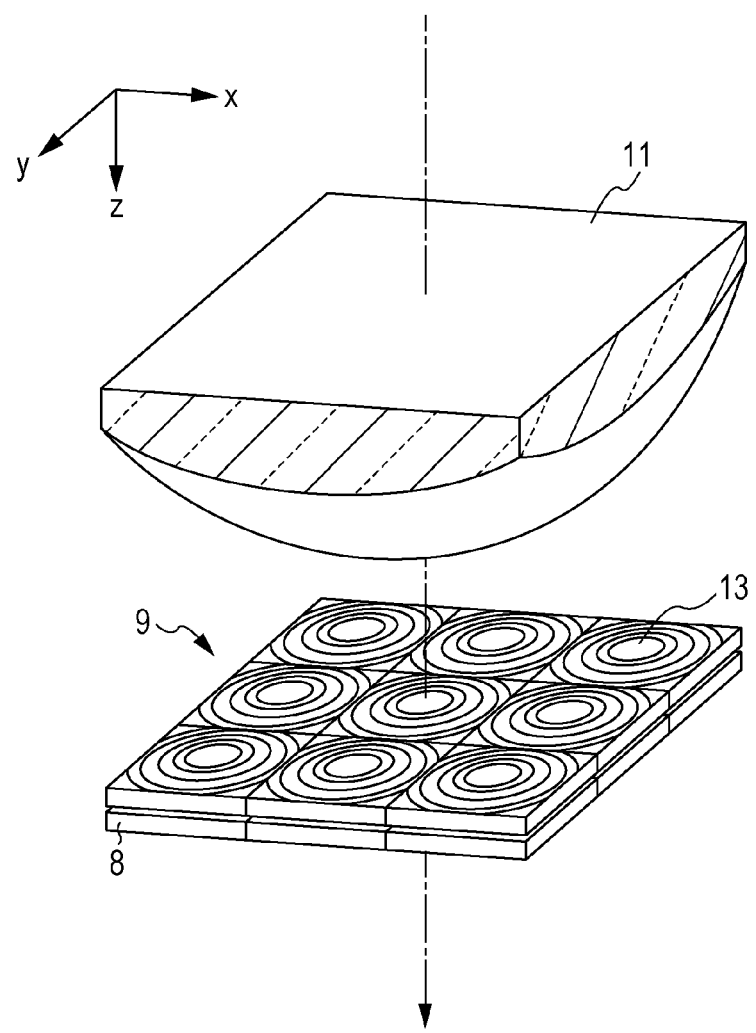
FIG. 5 is a perspective view illustrating an exemplary configuration of an image sensor in which a microlens is disposed over the surface of the pixels.

FIG. 5 is a perspective view illustrating the image sensor 9 in which microlenses 13 are disposed on the surfaces of the respective pixels 8. As illustrated in FIG. 5, the microlenses 13 may be disposed on the surfaces of the respective pixels 8. Through this configuration, the efficiency of light incident on the pixels 8 can be increased. A digital microlens (DML), for example, can be used as the microlenses 13. The DML is formed by densely disposing concentric ring structures that are smaller than the wavelength of the light. The DML condenses light through a change in the effective refractive index distribution.

In the present embodiment, the optical absorption member 6 is disposed between the lens optical system L and the optical element array 7. An optical absorption filter can be used as the optical absorption member 6. The optical absorption filter, for example, is an absorptive neutral density (ND) filter.

Figure 6:
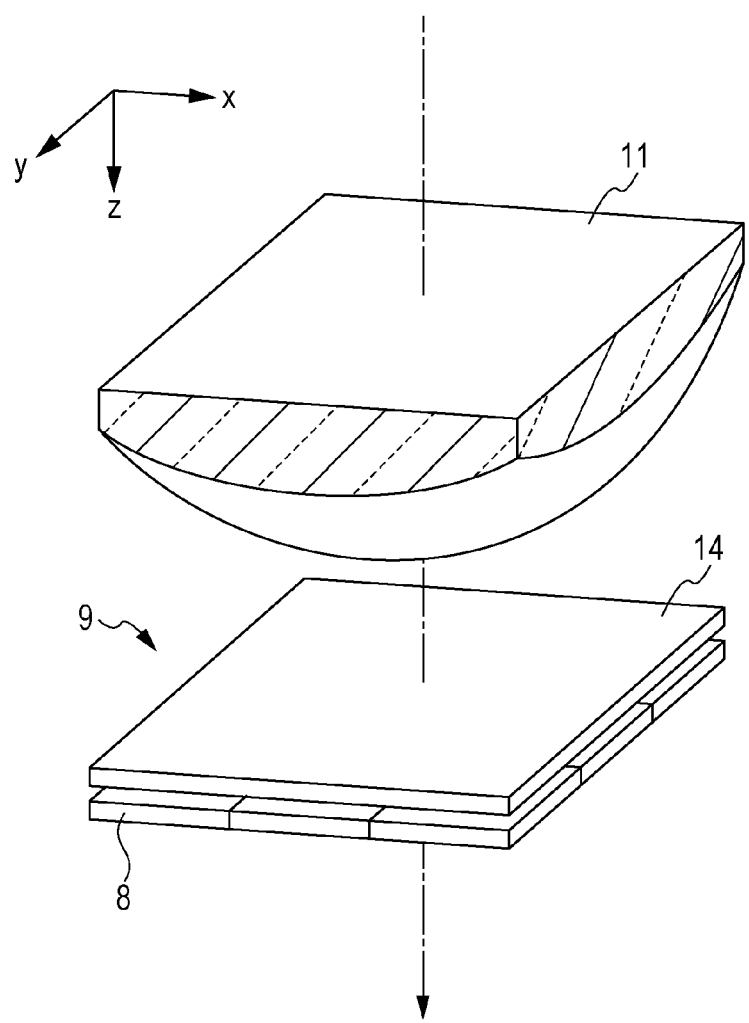
FIG. 6 is a perspective view illustrating an exemplary configuration in which an optical absorption filter is integrated with an image sensor.

FIG. 6 is a perspective view illustrating an exemplary configuration in which an optical absorption filter is integrated with the image sensor 9. As illustrated in FIG. 6, an optical absorption layer 14 functions as the optical absorption filter. The optical absorption layer 14 may be integrated with the image sensor 9. Through this configuration, the optical system can be simplified, and the assembly and the adjustment of the optical system become easier.

Hereinafter, an effect of suppressing ghost light by using an optical absorption filter will be described in detail.

Figure 7:
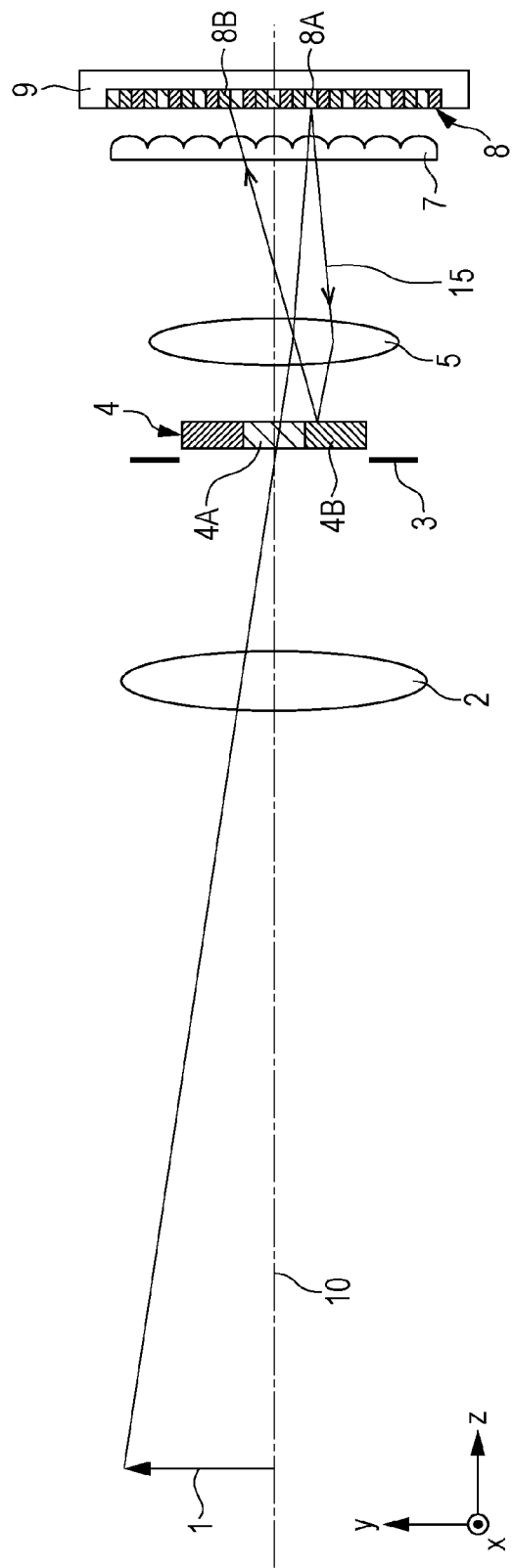
FIG. 7 is a schematic diagram for describing a mechanism by which a ghost image appears in an imaging apparatus that does not include an optical absorption filter.

FIG. 7 is an illustration for describing a mechanism by which a ghost image appears in an imaging apparatus that does not include an optical absorption filter. In FIG. 7, for simplicity, a focus is placed on light from a given point on the object 1, and only a principal ray is illustrated. Hereinafter, with reference to that principal ray, a mechanism by which a ghost image appears will be described.

The light from the object 1 passes, for example, through the first lens 2, a band-pass filter 4A in the band-pass filter array 4, the second lens 5, and the optical element array 7 in this order and reaches a predetermined pixel 8 in the image sensor 9. The predetermined pixel is a pixel 8A corresponding to the band-pass filter 4A.

Part of the light ray that travels toward the pixel 8A is reflected, for example, by the optical element array 7 and/or the surface of the pixel 8A. The reflected light becomes ghost light 15. The ghost light 15, for example, passes through the second lens 5 and is incident on the band-pass filter array 4. In this case, part of the ghost light 15, for example, reaches a band-pass filter 4B, which is different from the band-pass filter 4A.

The band-pass filter 4A and the band-pass filter 4B differ in terms of the wavelength band of light that they transmit. For example, due to the characteristics of a band-pass filter, such as an interference filter described above, the band-pass filter 4B hardly transmits the ghost light 15 that reaches the band-pass filter 4B. Most of the ghost light 15 is thus specularly reflected by the band-pass filter 4B.

Thereafter, the ghost light 15 that has been reflected by the band-pass filter 4B again passes through the second lens 5. The transmitted ghost light 15, for example, is then incident on a pixel 8B, which is disposed at a position different from the position where the pixel 8A is disposed, through the optical element array 7. The pixel 8B is a pixel corresponding to the band-pass filter 4B. The pixel 8B receives the ghost light 15. As a result, a ghost image appears in a captured image.

Figure 8:
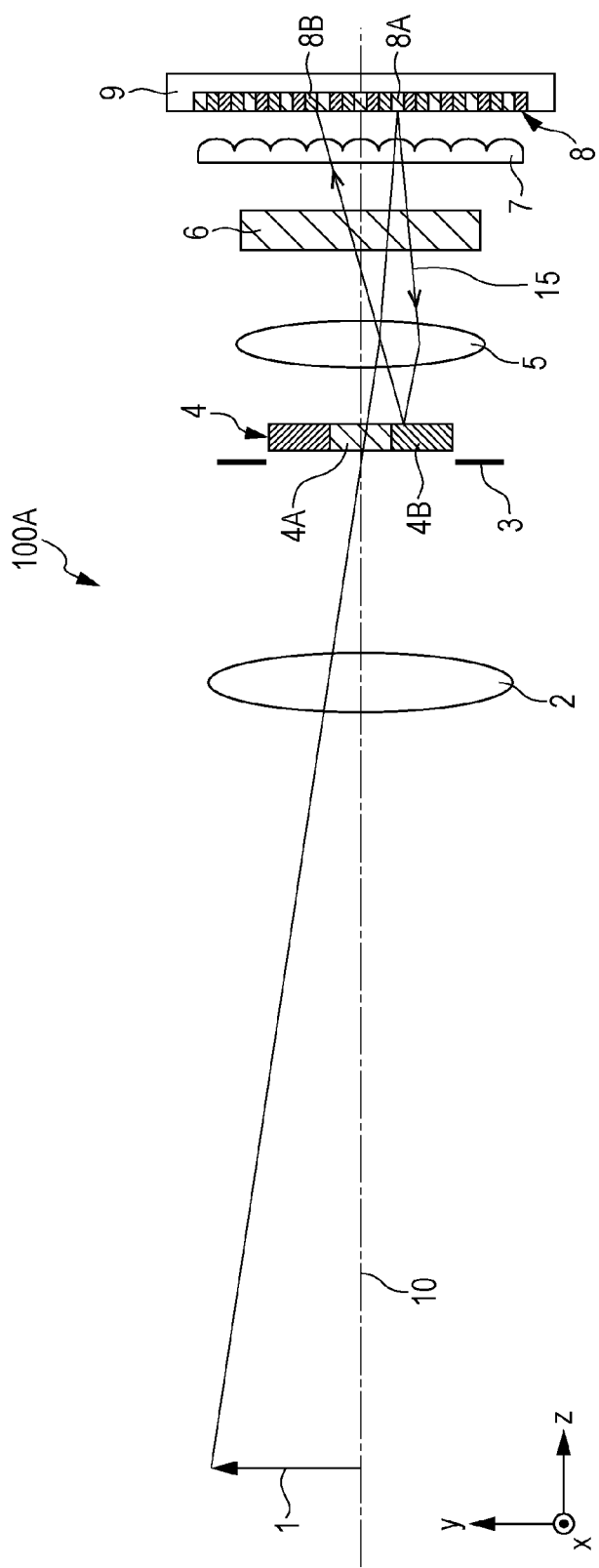
FIG. 8 is a schematic diagram for describing a mechanism by which ghost light is removed in an imaging apparatus according to the first exemplary embodiment.

FIG. 8 is an illustration for describing a mechanism by which the ghost light 15 is removed in the imaging apparatus 100A according to the present embodiment. With reference to FIG. 8, an effect of the optical absorption filter serving as the optical absorption member 6 will be described. As described above, an absorptive ND filter can be used as the optical absorption filter.

The light from the object 1 passes, for example, through the first lens 2, the band-pass filter 4A in the band-pass filter array 4, and the second lens 5, and then further passes through the optical absorption filter. The transmitted light reaches the pixel 8A corresponding to the band-pass filter 4A through the optical element array 7.

As described above, part of the light ray that has reached the pixel 8A is reflected by the surface of the pixel 8A. The reflected light may become the ghost light 15. The ghost light 15 passes through the optical absorption filter and thus has its quantity of light reduced. Part of the ghost light 15 that has passed through the optical absorption filter passes through the second lens 5 and reaches the band-pass filter array 4B, which is different from the band-pass filter array 4A. Part of the ghost light 15 is reflected by the band-pass filter array 4B and again passes through the second lens 5. The ghost light 15 that has passed through the second lens 5 again passes through the optical absorption filter. As a result, the ghost light 15 has its quantity of light further reduced. In the end, the ghost light 15, for example, reaches the pixel 8B, which is disposed at a position different from the position where the pixel 8A is disposed.

In this manner, the ghost light 15 passes through the optical absorption filter twice. In the specification of the present disclosure, a signal intensity corresponding to the quantity of light that contributes to a captured image is referred to as the quantity of signal light for a captured image, and a signal intensity corresponding to the quantity of light that contributes to a ghost image is referred to as the quantity of signal light for a ghost image. When the transmittance of the optical absorption filter is represented by T (<1), the ratio of the quantity of signal light for a ghost image to the quantity of signal light for a captured image is $T^2$ times greater in the configuration illustrated in FIG. 8 than in the configuration illustrated in FIG. 7.

Specifically, in the configuration illustrated in FIG. 7, for example, the ratio of the quantity of signal light for a ghost image to the quantity of signal light for a captured image may be 3%. In the meantime, in a case in which the optical absorption filter is disposed as illustrated in FIG. 8 and the transmittance T of the optical absorption filter is 50%, the ratio of the quantity of signal light for a ghost image to the quantity of signal light for a captured image is 0.03×0.5×0.5=0.0075. In this manner, the ratio between the quantities of signal light can be reduced to 0.75%.

In addition, in a case in which the transmittance T of the optical absorption filter is 30%, the ratio of the quantity of signal light for a ghost image to the quantity of signal light for a captured image is 0.03×0.3×0.3=0.0027. In this manner, the ratio between the quantities of signal light can be further reduced to 0.27%. When the above is taken into consideration, the ratio between the quantities of signal light may be from 30% to 50% inclusive.

In the present embodiment, the optical absorption filter has optical absorption characteristics of absorbing at least visible light. In order to efficiently reduce ghost light, it is desirable that the wavelength band of the optical absorption characteristics match the transmission wavelength band (390 nm to 750 nm) of the band-pass filter array 4. For example, in a case in which a plurality of images that are based on light in different transmission wavelength bands are to be obtained simultaneously by using visible light, as in the present embodiment, by disposing an optical absorption filter, an influence of ghost light of visible light that contributes to image formation can be reduced.

In the meantime, a near-infrared (IR)-cut filter that transmits visible light and cuts near-infrared rays is typically used in a compact digital camera. An IR-cut filter cuts unnecessary light (near-infrared rays) that does not contribute to image formation. In this respect, the intended use of the optical absorption filter of the present disclosure differs from that of the IR-cut filter.

According to the present disclosure, for example, a plurality of images can be captured simultaneously by using near-infrared rays instead of visible light. Near-infrared rays are light (electromagnetic waves) at a wavelength in a range from approximately 700 nm to 2.5 μm. In a case in which near-infrared rays are used, transmission wavelength bands of equal widths can be assigned to the respective rectangular band-pass filters 4a through 4i in the wavelength bands of the near-infrared rays. In addition, an optical absorption filter having optical absorption characteristics of absorbing at least near-infrared rays may be used as the optical absorption member 6. Through this configuration, an influence of ghost light of near-infrared rays that contribute to image formation can be suppressed efficiently.

According to the present embodiment, image information with little influence of ghost light can be obtained through a simple configuration.

Hereinafter, modifications of the present embodiment will be described.

In the present embodiment, the widths of the transmission wavelength bands of the respective band-pass filters 4a through 4i in the band-pass filter array 4 are set equally to 40 nm. The present disclosure is not limited thereto, and the transmission wavelength bands of the respective band-pass filters 4a through 4i may be set in accordance with the product specifications. For example, the widths of the transmission wavelength bands of the respective band-pass filters 4a through 4i do not need to be equal to one another. The width of a transmission wavelength band may be set to several nanometers, and a narrow-band interference filter may be used as a band-pass filter. Through this configuration, pinpointing information on light having components of respective wavelengths can be obtained.

In addition, in the present embodiment, an example in which the nine rectangular band-pass filters are disposed in a 3×3 matrix has been illustrated. Aside from such a configuration, for example, a plurality of rectangular band-pass filters may be disposed in a 2×2 matrix, a 4×4 matrix, or a 5×5 matrix. In such a case, the plurality of pixels 8 may be disposed in accordance with the shape of the band-pass filter array 4. In addition, the shapes of the band-pass filters do not need to be identical, and may, for example, be a circle, a rectangle, or a polygon.

Furthermore, the wavelength band can be divided only in a one-dimensional direction. For example, a plurality of band-pass filters may be disposed in a 1×2 matrix, a 1×3 matrix, or a 1×4 matrix. In such a case, a lenticular lens, instead of a microlens array, is used as the optical element array 7. A lenticular lens is constituted by cylindrical lenses disposed in the direction in which the wavelength band is divided.

In addition, the imaging wavelength range of the band-pass filter array 4 has been set to a range from 380 nm to 750 nm of visible light. The present disclosure is not limited thereto, and the imaging wavelength range may include an ultraviolet range and/or an infrared range.

The pixel region of the pixels 8a through 8i illustrated in FIG. 4 corresponds to a single pixel in the image sensor 9. The present disclosure is not limited thereto, and the pixel region of the pixels 8a through 8i may, for example, correspond to 2×2 pixels in the image sensor 9. In other words, the number of pixels corresponding to a single microlens may be an integral multiple of the number of divided optical regions.

In the present embodiment, as described above, the transmission wavelength bands of the respective band-pass filters 4a through 4i differ from one another. The present disclosure is not limited thereto, and the transmission wavelength bands (optical characteristics) of some of the band-pass filters may be identical. For example, the optical characteristics of a plurality of band-pass filters may be set to be identical in a wavelength band in which the light-receiving sensitivity of the image sensor is low. By integrating the output signals of pixels corresponding to the stated plurality of band-pass filters, the S/N ratio can be improved.

In the present embodiment, the optical region includes at least the first optical region and the second optical region that have different spectral transmittance characteristics, but the present disclosure is not limited thereto. The optical region may include at least a first optical region and a second optical region that have different polarization characteristics. In place of the band-pass filter array 4, polarizers with different polarization directions may be disposed in the respective optical regions, and thus image information that is based on light having different polarization components can be obtained simultaneously. In this case as well, if a reflective wire-grid polarizer, for example, is used as a polarizer, a ghost image may appears, as in the problem of the present disclosure. Through a configuration that is equivalent to the configuration of the present embodiment, a plurality of images that mutually differ in terms of their polarization characteristics can be obtained simultaneously by using a single imaging optical system under a plurality of polarization conditions. A high-precision imaging apparatus for image sensing with little ghost image can be obtained.

In the present embodiment, the optical absorption filter serving as the optical absorption member 6 is disposed between the lens optical system L and the optical element array 7. The present disclosure is not limited thereto, and the optical absorption filter may be integrated with the optical element array 7. Alternatively, as illustrated in FIG. 6, the optical absorption filter may be integrated with the image sensor 9.

In addition, the optical element array 7 may be integrated with the image sensor 9. Alternatively, the microlenses 13 (FIG. 5) may be provided between the optical element array 7 and the image sensor 9, and the optical element array 7 may be integrated with the image sensor 9 with the microlenses 13 (FIG. 5) interposed therebetween. Through this configuration, positioning can be achieved in a wafer process, which can facilitate positioning and increase the accuracy in positioning.

The present disclosure may also be applied to an imaging apparatus other than the imaging apparatus that includes an optical system including an optical function element and the optical element array. For example, ghost light can be reduced even in a case in which an optical function element and an optical element array are not provided, as in a typical digital camera. For example, reflected light from an image sensor, or in other words, ghost light is reflected by a lens optical system and the inside of a lens barrel. A ghost image may appear due to such reflected light. In an imaging apparatus that includes at least a lens optical system and an image sensor, by disposing, between the lens optical system and the image sensor, an optical element that absorbs at least visible light and that has substantially uniform optical absorption characteristics across the entire region therein through which light passes, a high-precision imaging apparatus with little ghost image can be provided.

Second Embodiment

Figure 9:
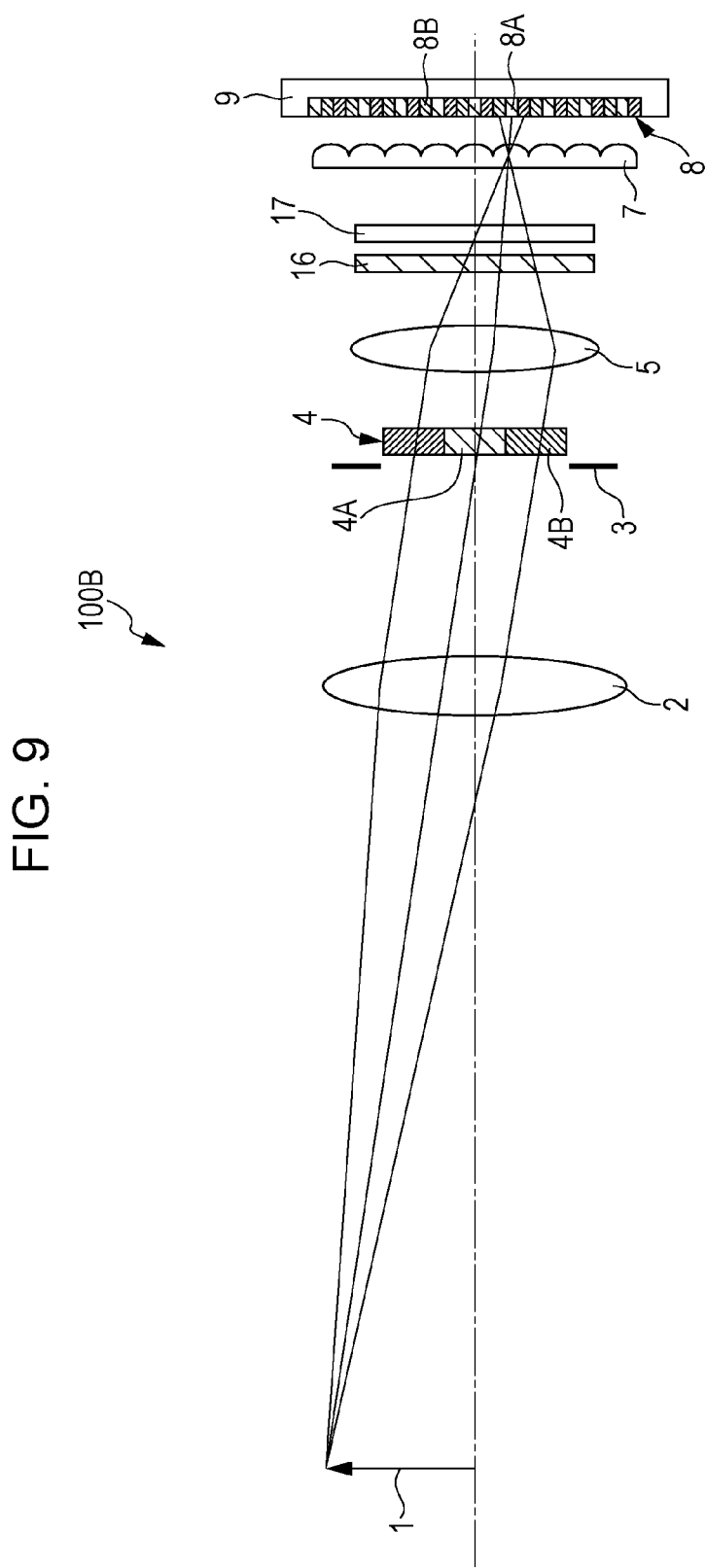
FIG. 9 is a schematic diagram illustrating an imaging apparatus according to a second exemplary embodiment.

FIG. 9 is a schematic diagram illustrating an imaging apparatus 100B according to the present embodiment.

The imaging apparatus 100B according to the present embodiment differs from the imaging apparatus 100A according to the first embodiment in that a polarizer 16 and a quarter-wave plate 17 are provided in place of the optical absorption filter serving as the optical absorption member 6. Hereinafter, primarily the differences from the first embodiment will be described, and detailed descriptions of similar content will be omitted.

As illustrated in FIG. 9, the imaging apparatus 100B includes the polarizer 16 and the quarter-wave plate 17, which serve as the optical absorption member 6, disposed between the second lens 5 and the optical element array 7.

The polarizer 16 is an absorptive linear polarizer that transmits light vibrating in a direction of a specific polarization axis. The quarter-wave plate 17 is a phase plate that converts linearly polarized light to circularly polarized light or to elliptically polarized light. The polarizer 16 is disposed in the optical absorption member 6 toward the band-pass filter array 4, and the quarter-wave plate 17 is disposed in the optical absorption member 6 toward the image sensor 9.

It is to be noted that the polarizer 16 and the quarter-wave plate 17 do not need to be disposed at the positions illustrated in FIG. 9. For example, the polarizer 16 and the quarter-wave plate 17 may be disposed between the band-pass filter array 4 and the second lens 5. Alternatively, the polarizer 16 may be disposed between the band-pass filter array 4 and the second lens 5, and the quarter-wave plate 17 may be disposed between the second lens 5 and the optical element array 7.

The imaging apparatus 100A according to the first embodiment has an advantage in that ghost light can be reduced with a simple configuration. However, the ghost light cannot be removed completely. In order to increase the effect of removing the ghost light (hereinafter, referred to as a ghost light removal effect), it is desired that the transmittance of the optical absorption filter be reduced. However, if the transmittance of the optical absorption filter is reduced, the quantity of light that contributes to a signal for a captured image is reduced. In this manner, there is a trade-off between the ghost light removal effect and the increase in the imaging sensitivity.

With the imaging apparatus 100B according to the present embodiment, by using the polarization characteristics of light, ghost light can be removed completely in principle.

Hereinafter, with reference to FIGS. 10A through 10D, a principle in which ghost light is removed by using the polarization characteristics of light will be described.

Figure 10A:
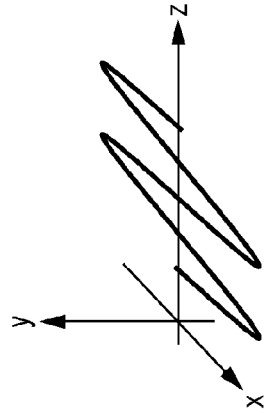
FIG. 10A is a schematic diagram illustrating vibrations of the electric field of signal light that has passed through a polarizer in the imaging optical system illustrated in FIG. 9.
Figure 10B:
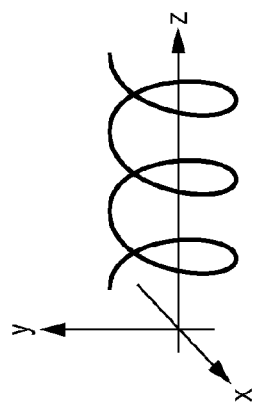
FIG. 10B is a schematic diagram illustrating vibrations of the electric field of the signal light that has passed through a quarter-wave plate in the imaging optical system illustrated in FIG. 9.
Figure 10C:
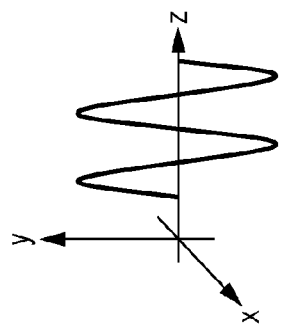
FIG. 10C is a schematic diagram illustrating vibrations of the electric field of ghost light in the imaging optical system illustrated in FIG. 9.
Figure 10D:
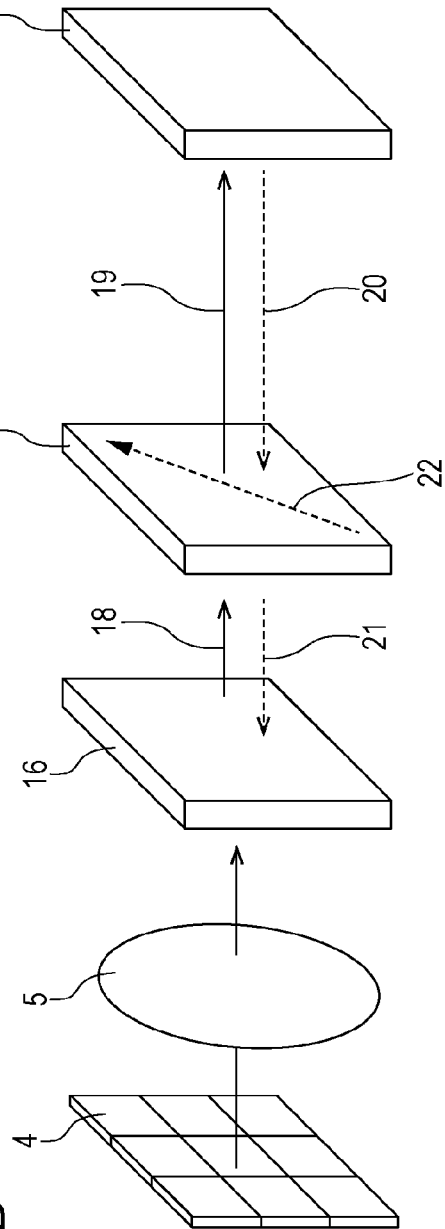
FIG. 10D is an enlarged schematic diagram illustrating part of an imaging optical system illustrated in FIG. 9.

FIG. 10D is an enlarged schematic diagram illustrating part of the imaging optical system illustrated in FIG. 9. Specifically, FIG. 10D illustrates the configuration of the optical system extending from the band-pass filter array 4 to the vicinity of the image sensor 9. It is to be noted that some of the optical elements are omitted.

Signal light that has passed through the band-pass filter array 4 and the second lens 5 passes through the polarizer 16 that is disposed in the optical axis. The polarizer 16 transmits only the light that vibrates in the y-axis direction illustrated in FIG. 10A. When the light passes through the polarizer, a linear polarization component that vibrates in the direction of the transmission axis (y-axis) of the polarizer is extracted, and a polarization component that vibrates in the direction orthogonal to the transmission axis (x-axis direction) is blocked. For example, when the signal light is visible light and is unpolarized or circularly polarized, the quantity of light transmitted through the polarizer 16 is reduced to approximately 35% to 45% of the quantity of the incident light.

When the light from the object 1 is unpolarized or circularly polarized, the transmission axis of the polarizer 16 may extend in the x-direction or the y-direction. In the meantime, when the light from the object 1 is linearly polarized, the polarizer 16 is disposed such that the direction of the transmission axis thereof is parallel to the polarization direction of the light from the object 1. In FIG. 10D, the polarization direction of signal light 18 that has passed through the polarizer 16 is the y-axis direction. In that case, the direction in which the electric field of the signal light 18 vibrates is the y-axis direction, as illustrated in FIG. 10A.

Subsequently, the signal light 18 passes through the quarter-wave plate 17. Thus, the linearly polarized signal light changes to circularly polarized light. The quarter-wave plate 17 is disposed in the optical axis such that a crystallographic axis 22 of the quarter-wave plate 17 extends in a direction that is at an angle of +45 degrees or −45 degrees relative to the y-axis. The vibration of the electric field of signal light 19 that has passed through the quarter-wave plate 17 propagates in the z-axis direction while rotating along the xy-plane, as illustrated in FIG. 10B.

The circularly polarized signal light 19 is received by the image sensor 9. As in the first embodiment, part of the light rays that have reached the image sensor 9 is reflected by the surface of the image sensor 9. The reflected light may become ghost light 20.

The circularly polarized ghost light 20 passes through the quarter-wave plate 17 and changes to linearly polarized light. The polarization direction of ghost light 21 is orthogonal to the polarization direction of the signal light 18. The electric field of the ghost light 21 vibrates in the x-axis direction, as illustrated in FIG. 10C. The ghost light 21 is then incident on the polarizer 16. However, the polarization direction of the ghost light 21 is orthogonal to the direction of the transmission axis of the polarizer 16, and thus the ghost light 21 does not pass through the polarizer 16 and is absorbed by the polarizer 16. As a result, the ghost light 21 does not reach the band-pass filter array 4 that could have served as a reflection surface, and thus a ghost image does not appear.

According to the imaging apparatus 100B, of the light from the object 1, only linearly polarized light is received. Therefore, there is an advantage in that an effect that can be obtained when a polarization filter is attached to a typical camera can be obtained. For example, in a case in which light is reflected by the surface of the object 1, the reflection of the light by the surface can be reduced. In addition, a ghost image appearing due to reflected light from a water surface or a glass surface can be removed. A clear image of the object 1 can be captured even when imaging through a glass.

In addition, reflected light from the water vapor in the air can be removed, and thus a high-contrast image of, for example, the tones of the blue sky, the surface of a mountain, or a building can be captured.

In addition, when the light from the object 1 is unpolarized or circularly polarized, the transmission axis of the polarizer 16 may extend in any direction. Therefore, the polarizer 16 may be integrated with the quarter-wave plate 17. By providing a mechanism for rotating the integrated element to a predetermined angle, an image that is based on light of a desired polarization state can be captured.

In the present embodiment, an example in which the quarter-wave plate 17 is used has been illustrated. However, the performance of a typical wave plate is greatly dependent on the wavelength of light to be used. Therefore, in the range of visible light, for example, it is not possible to obtain a constant phase difference without a variation.

By using an achromatic wave plate as a wave plate, flat phase characteristics can be obtained in a broad wavelength band. An achromatic wave plate can be obtained by combining two crystals having different dispersion characteristics. Any one from a broad range of known achromatic wave plates can be used as the achromatic wave plate. By using an achromatic wave plate, the ghost light removal effect can be obtained. In a case in which the wavelength range is narrow or a ghost image is permitted to a certain degree, a typical wave plate may be used.

Third Embodiment

An imaging apparatus 100C according to the present embodiment differs from the imaging apparatus 100A according to the first embodiment in that a light-blocking region is provided in an optical region L1.

Figure 11A:
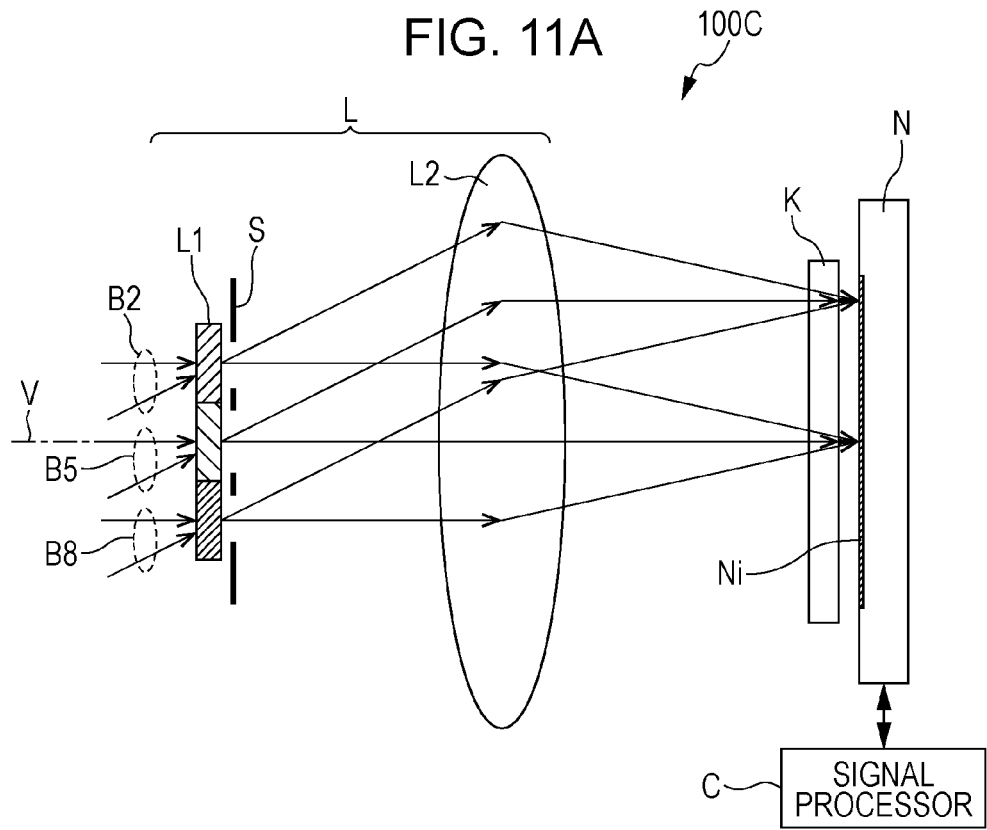
FIG. 11A is a schematic sectional view illustrating an imaging apparatus according to a third exemplary embodiment.

FIG. 11A is a schematic diagram illustrating the imaging apparatus 100C according to a third embodiment. The imaging apparatus 100C according to the present embodiment includes a lens optical system L having an optical axis V, an optical element array K disposed at or in the vicinity of the focal point of the lens optical system L, an image sensor N, and a signal processor C.

The lens optical system L includes the optical region L1 that includes a plurality of optical regions, a stop S that includes a plurality of openings, and a lens L2 that condenses the light that has passed through the stop S. The optical region L1 is disposed on a side of the stop S where the object is located. The lens L2 is disposed on a side of the stop S where the image sensor is disposed. The optical region L1 is disposed in the vicinity of the stop S. The vicinity as used herein, for example, refers to a range within a distance that is equal to or less than one-half the diameter of the stop and includes a case in which the optical region L1 is in contact with the stop S. The lens optical system L in the present embodiment is an image-side telecentric optical system.

Figure 11B:
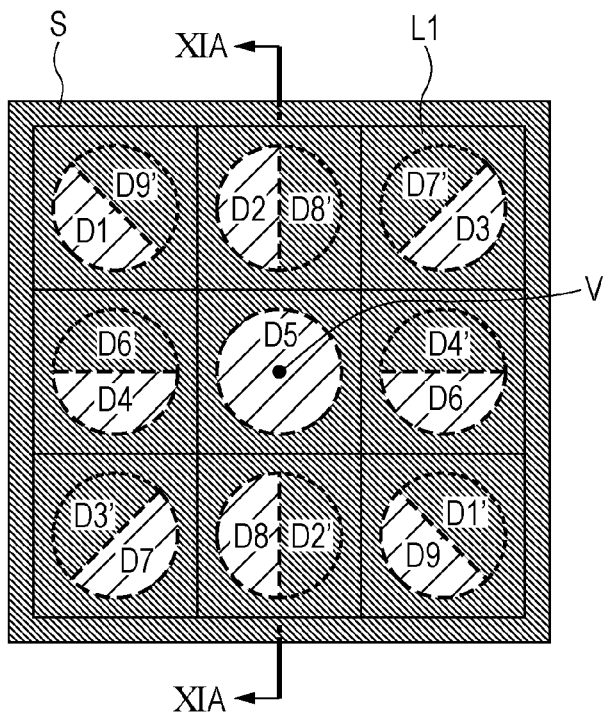
FIG. 11B is a front view illustrating a positional relation between optical regions in an optical region and openings in a stop.

FIG. 11B illustrates a positional relation between the plurality of optical regions in the optical region L1 illustrated in FIG. 11A and the plurality of openings in the stop S. FIG. 11B is a front view of the optical region L1 and the stop S as viewed from the side of the object. FIG. 11A is a sectional view taken along the XIA-XIA line illustrated in FIG. 11B.

The optical region L1 includes nine spectral filters squarely arrayed in a 3×3 matrix. Regions in which first, second, third, and fourth spectral filters are provided are located symmetrically to respective regions in which ninth, eighth, seventh, and sixth spectral filters are provided, with respect to the optical axis V of the lens optical system L. The shape of each of the spectral filters is a square, and the spectral filters have the same area. However, the shapes or the areas of the optical regions may differ from one another. The nine spectral filters have spectral characteristics of transmitting light in mutually different first through ninth wavelength bands. The first through ninth wavelength bands may be wavelength bands included in a visible light range or a near-infrared range.

Such spectral filters can be obtained by forming a dielectric multilayer film on one side or both sides of the respective spectral filters. The stop S having the nine openings is disposed on an image side of the optical region L1. The nine openings face the respective nine spectral filters. To face as used herein means that a spectral filter is disposed close to an opening so as to face the opening in the direction of the optical axis. Hereinafter, the regions in the respective nine spectral filters that face the openings are referred to as first through ninth optical regions (D1 through D9). The optical regions may also be referred to as optical transmission regions. In addition, regions in the respective nine spectral filters other than the regions that face the openings may be referred to as first through ninth light-blocking regions. The regions in the stop S that face the light-blocking regions may be formed by an optical absorption member. The optical absorption member has substantially uniform optical absorptance across a region through which light passes. In addition, the optical absorption member has substantially the same optical absorptance in the wavelength bands of light that passes through the first through ninth spectral filters. That the optical absorptance is substantially uniform across a region through which the light passes means that the optical absorptance per unit area is identical across the region through which the light passes or that a relative error in the optical absorptance per unit area is within 10% in the region through which the light passes. In addition, that the optical absorptance is substantially the same in the wavelength bands of light that passes through the first through ninth optical regions means that the optical absorptance is uniform across the entire wavelength band of the light that passes through the first through ninth optical regions or that a relative error in the optical absorptance in the wavelength band is within 10%.

The shape of each of the openings that face the optical regions D1 through D4 and D6 through D9 is a hemisphere. The shape of the opening that faces the fifth optical region D5 is a circle. The optical regions D1 through D4 and D6 through D9 are disposed so as not to overlap another optical region when these optical regions are rotated by 180° about the optical axis V.

A plurality of pixels in the image sensor N are divided into pixel groups each including nine pixels P1 through P9 that are arranged in a 3×3 matrix.

The signal processor C is a signal processing circuit electrically coupled to the image sensor N. The signal processor C processes an electric signal outputted from the image sensor N so as to generate and record image information.

In the present embodiment, light that has passed through the optical regions in the optical region L1 passes through the stop S and the lens L2 in this order and is then incident on the optical element array K. The optical element array K guides the light that has passed through the optical regions D1 through D9 to the respective pixels P1 through P9 of each pixel group in the image sensor N. The signal processor C generates pieces of image information corresponding to the respective first through ninth wavelength bands from pixel values obtained in the pixels P1 through P9 and outputs the generated image information.

In FIG. 11A, light beams B2, B5, and B8 are light beams that pass, respectively, through the optical regions D2, D5, and D8 in the optical region L1. These light beams pass through the optical region L1, the stop S, the lens L2, and the optical element array K in this order, and then reach an imaging surface Ni of the image sensor N. It is to be noted that, since FIG. 11A is a sectional view taken along the XIA-XIA line illustrated in FIG. 11B, the light beams that pass through the other optical regions are not illustrated in FIG. 11A.

As illustrated in FIG. 11A, the optical element array K is disposed at a position that is in the vicinity of the focal point of the lens optical system L and that is spaced apart from the imaging surface Ni by a predetermined distance.

Figure 12A:
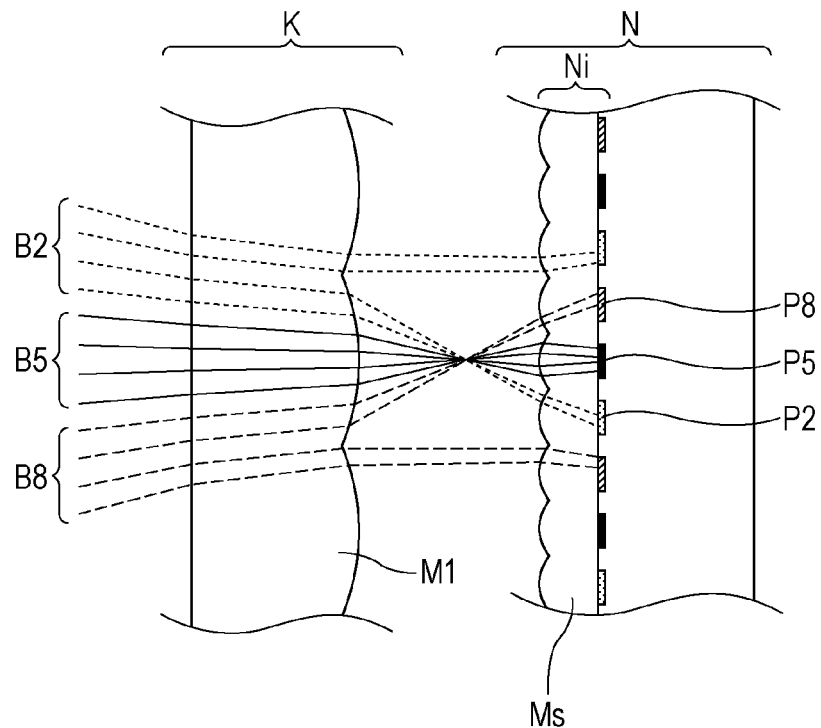
FIG. 12A is an enlarged view of an optical element array and an image sensor illustrated in FIG. 11A.
Figure 12B:
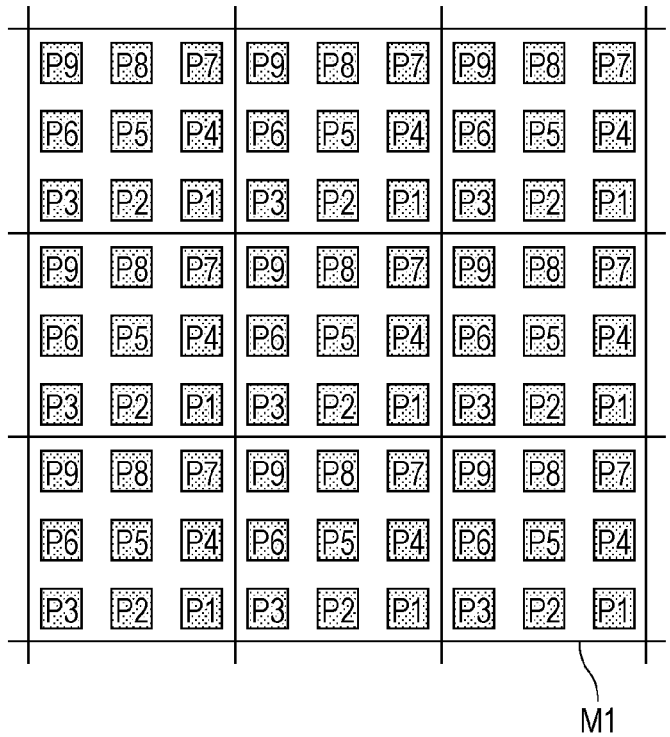
FIG. 12B illustrates a plurality of pixels in an image sensor.

FIG. 12A is an enlarged view of the optical element array K and the image sensor N illustrated in FIG. 11A. FIG. 12B illustrates a positional relation between the optical element array K and the pixels in the image sensor N. The optical element array K has a structure in which microlenses M1, which are optical components, are arrayed along a plane orthogonal to the optical axis. The optical element array K is disposed such that a face in which the microlenses M1 are provided faces the imaging surface Ni. Pixels P are disposed in a matrix in the imaging surface Ni. As described above, the pixels P can be classified into the pixel P1 through the pixel P9.

The pixel P1 through the pixel P9 are disposed in a 3×3 matrix forming a set. The optical element array K is disposed such that a given one of the microlenses M1 serving as the optical components covers the pixel P1 through the pixel P9 disposed in a 3×3 matrix on the imaging surface Ni that correspond to the given microlens M1. Microlenses Ms are provided on the imaging surface Ni so as to cover the surfaces of the pixels.

The optical element array K is designed such that most of the light beams that have passed through the respective optical regions D1 through D9 in the optical region L1 reach the respective pixels P1 through P9 in the imaging surface Ni. Specifically, the stated configuration is achieved by setting parameters, such as the refractive index of the optical element array K, the distance from the imaging surface Ni, and the radius of curvature of the surface of each microlens M1, as appropriate.

Through the configuration described above, the pixels P1 through P9 generate respective pieces of image information corresponding to the light in mutually different wavelength bands. In other words, the imaging apparatus 100C can obtain a plurality of pieces of image information formed by the light in mutually different wavelength bands by a single imaging optical system through a single instance of imaging.

In the present embodiment, the openings other than the opening in the center of the stop S are disposed so as not to overlap another opening when the stop S is rotated about the optical axis V. Accordingly, an occurrence of ghost light can be suppressed. Hereinafter, this effect will be described.

Figure 13A:
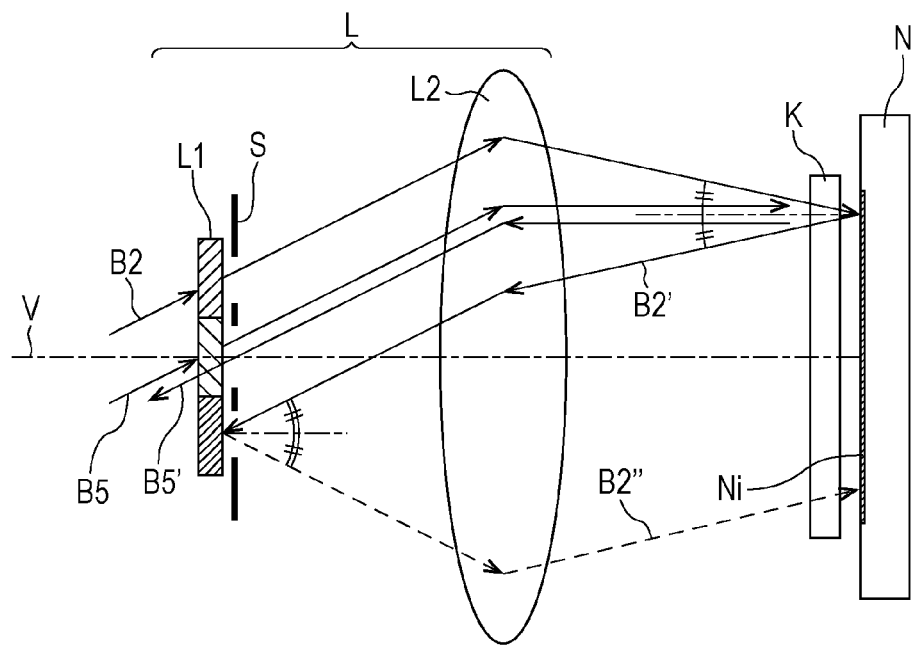
FIG. 13A is an illustration for describing ghost light occurring in a case in which the shape of each optical region is a circle.
Figure 13B:
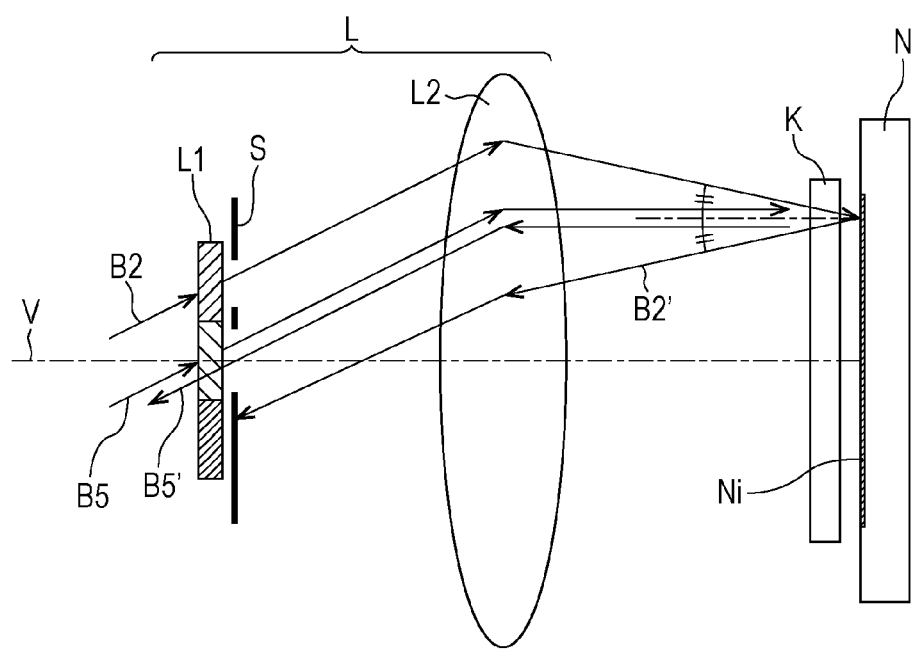
FIG. 13B is an illustration for describing ghost light occurring in a case in which each optical region has the shape illustrated in FIG. 11B.

FIGS. 13A and 13B are illustrations for describing the effect of suppressing ghost light. First, an occurrence of ghost light in a case in which the openings in the stop S corresponding (facing) the optical regions D1 through D9 are all circular will be described. FIG. 13A illustrates a principle in which ghost light is generated in a case in which the optical regions D1 through D9 are all circular. FIG. 13A is an illustration in which a focus is placed on two light beams from the object that are incident on the respective optical regions D2 and D5.

The light beam B5 passes through the optical region D5 in the optical region L1, the stop S, the lens L2, and the optical element array K in this order, and then reaches the imaging surface Ni of the image sensor N. Part of the light incident on the respective pixels is detected as an image signal, and another part of the light is specularly reflected to result in reflected light B5'. The lens optical system L is an image-side telecentric optical system, and thus the reflected light B5' is reflected in the direction normal to the imaging surface. The reflected light B5' passes through the optical element array K, the lens L2, and the stop S in this order, and then reaches the optical region D5 in the optical region L1. The spectral distribution (wavelength band) of the reflected light B5' is the same as the transmission wavelength band of the optical region D5, and thus most of the reflected light B5' passes through the optical region D5 and returns toward to object.

The light beam B2 passes through the optical region D2 in the optical region L1, the stop S, the lens L2, and the optical element array K in this order, and then reaches the imaging surface Ni of the image sensor N. Part of the light incident on the respective pixels is detected as an image signal, and another part of the light is specularly reflected to result in reflected light B2'. The lens optical system L is an image-side telecentric optical system, and thus the reflected light B2' is reflected at an angle that is the same as the angle at which the reflected light B2' is incident. The reflected light B2' passes through the optical element array K, the lens L2, and the stop S in this order, and then reaches the optical region D8 in the optical region L1. Here, if the transmission wavelength band of the optical region D8 is different from the transmission wavelength band of the optical region D2, most of the light at wavelengths outside the transmission wavelength band of the optical region D8 is reflected by the optical region D8. Therefore, most of the light incident on the optical region D8 is specularly reflected and reflected light B2" is generated. The reflected light B2" passes through the stop S, the lens L2, and the optical element array K in this order, and then reaches the imaging surface Ni of the image sensor N. Since the lens optical system L is an image-side telecentric optical system, the light beam that has passed through the optical region D2 travels through the aforementioned path, and the light that has reached the imaging surface becomes the ghost light. Although a focus has been placed only on the optical region D2 in the preceding description, in reality, ghost light is also generated by light that passes through an optical region other than the optical region D2.

When such ghost light is generated, in addition to necessary spectral information, unnecessary spectral information is mixed in the information on the pixels. This situation prevents high-precision spectral information from being obtained.

Subsequently, an effect of suppressing ghost light in a case in which the optical regions D1 through D4 and D6 through D9 are disposed so as not to be symmetric with respect to the optical axis V, as illustrated in FIG. 11B, will be described. FIG. 13B illustrates an optical path formed in a case in which the optical regions D1 through D9 have the shapes illustrated in FIG. 11B. In the illustration, a focus is placed on two light beams incident on the respective optical regions D2 and D5. The light beam B5 travels through the same optical path as in the case illustrated in FIG. 13A, and the reflected light B5' returns toward the object. Meanwhile, the light beam B2 travels through the same optical path as in the case illustrated in FIG. 13A, and returns toward a region D2' illustrated in FIG. 11B. Therefore, most of the light beam B2' is blocked by the stop S prior to reaching the optical region L1. In a similar manner, with regard to all of the light beams (not illustrated) other than the light beam B5, most of the reflected light from the imaging surface is blocked by the stop S. Accordingly, ghost light described with reference to FIG. 13A is hardly generated. In other words, the ghost light can be suppressed with the configuration illustrated in FIG. 13B.

In this manner, as the optical regions are configured as illustrated in FIG. 11B, the ghost light can be reduced. As compared with a case in which all of the nine openings facing the respective optical regions D1 through D9 are circular, a higher-precision spectral image can be obtained.

Fourth Embodiment

An imaging apparatus 100D according to the present embodiment differs from the imaging apparatus 100A according to the first embodiment in that a light-blocking region is provided in the lens optical system L, as in the third embodiment.

Figure 14A:
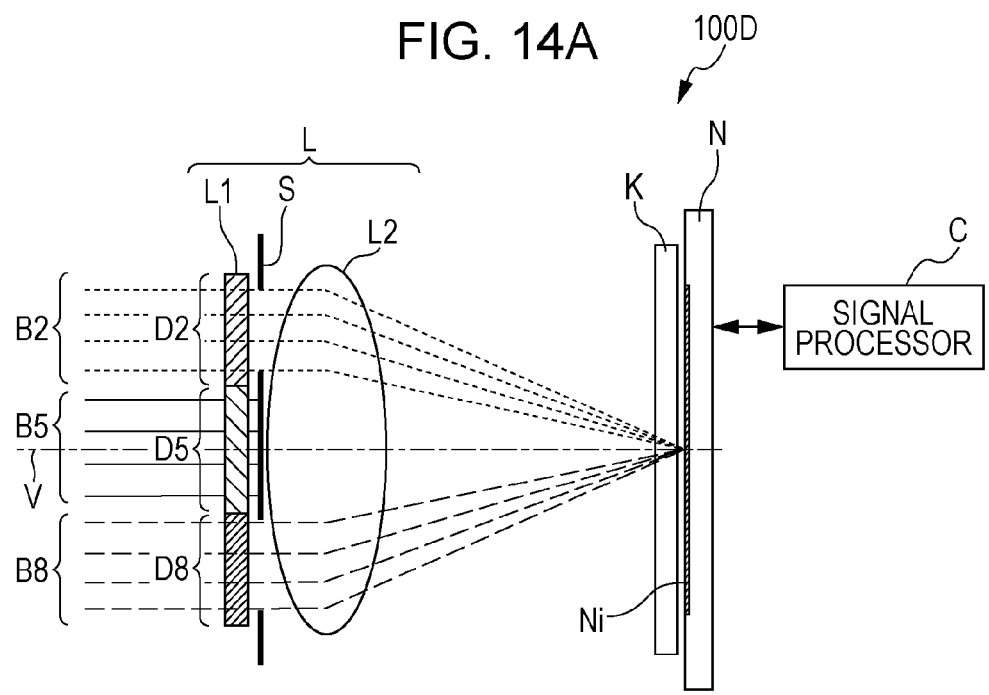
FIG. 14A is a schematic sectional view illustrating an imaging apparatus according to a fourth exemplary embodiment.

FIG. 14A is a schematic sectional view illustrating the imaging apparatus 100D according to the present embodiment. The imaging apparatus 100D according to the present embodiment includes the lens optical system L having the optical axis V, the optical element array K disposed at or in the vicinity of the focal point of the lens optical system L, the image sensor N, and the signal processor C. Hereinafter, descriptions of what are common to those in the third embodiment are omitted, and primarily the differences will be described.

Figure 14B:
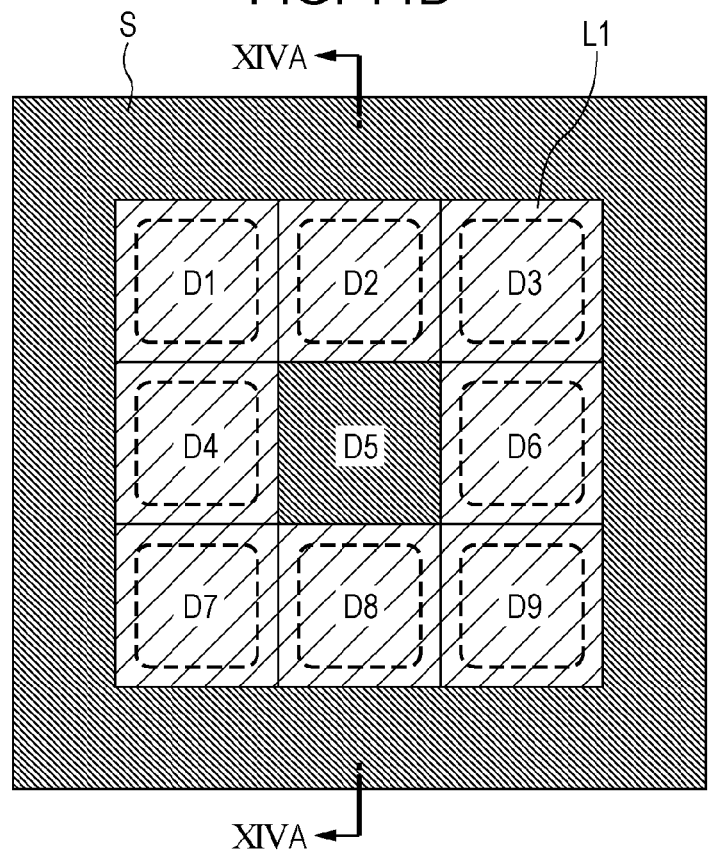
FIG. 14B is a front view illustrating a positional relation between optical regions in an optical region and openings in a stop.

FIG. 14B illustrates a positional relation between the optical regions in the optical region L1 illustrated in FIG. 14A and the openings in the stop S. FIG. 14B is a front view of the optical region L1 and the stop S as viewed from the side of the object. FIG. 14A is a sectional view taken along the XIVA-XIVA line illustrated in FIG. 14B.

The optical region L1 includes the first through fourth optical regions (D1 through D4) that transmit light in, respectively, the first through fourth wavelength bands, the fifth optical region (D5) that transmits light regardless of the wavelength band thereof, and the sixth through ninth optical regions (D6 through D9) that transmit light in, respectively, the sixth through ninth wavelength bands. The first through ninth optical regions are arrayed at equal intervals in a 3×3 matrix. The shape of each of the optical regions is a square, and the optical regions have the same area. However, the shapes or the areas of the optical regions may differ from one another.

The first through fourth and sixth through ninth optical regions may, for example, be formed by forming a filter constituted by a dielectric multilayer film on one side or both sides of the first through fourth and sixth through ninth optical regions. The fifth optical region may be formed, for example, by a transparent glass. Alternatively, nothing may be provided in the fifth optical region D5. In other words, the fifth optical region D5 may be an opening. As will be described later, a portion of the stop S that faces the fifth optical region D5 is a light-blocking section (i.e., light-blocking region). Therefore, the portion of the stop S that faces the fifth optical region D5 may be formed by a member that does not transmit light, such as an optical absorption member. The first through fourth and sixth through ninth wavelength bands may be mutually different or some of the first through fourth and sixth through ninth wavelength bands may be the same. The first through fourth and sixth through ninth wavelength bands may, for example, be wavelength bands included in a visible light range or a near-infrared range.

The light-blocking region in the stop S has substantially uniform optical absorptance across the region through which the light passes, as in the third embodiment, and has substantially the same optical absorptance in the wavelength bands of the light that passes through the first through ninth optical regions. That the optical absorptance is substantially uniform across the region through which the light passes means that the optical absorptance per unit area is identical across the region through which the light passes or that a relative error in the optical absorptance per unit area is within 10% in the region through which the light passes. In addition, that the optical absorptance is substantially the same in the wavelength bands of the light that passes through the first through ninth optical regions means that the optical absorptance is identical across the entire wavelength band of the light that passes through the first through ninth optical regions or that a relative error in the optical absorptance in the wavelength band is within 10%.

The stop S has the openings at positions corresponding to the optical regions D1 through D4 and D6 through D9. A portion of the stop S that faces the optical region D5 is a light-blocking section that does not transmit light. Therefore, the light that has passed through the optical region D5 is not incident on pixels in the image sensor N. In the example illustrated in FIG. 14B, the area of each opening is approximately 70% of the area of the facing optical region, but the present disclosure is not limited thereto.

In the present embodiment, the light that has passed through the optical regions in the optical region L1 passes through the stop S and the lens L2 in this order and is then incident on the optical element array K. The optical element array K guides the light that has passed through the optical regions D1 through D4 and D6 through D9 to the respective pixels P1 through P4 and P6 through P9 of each pixel group in the image sensor N. The signal processor C generates pieces of image information corresponding to the respective first through fourth and sixth through ninth wavelength bands from pixel values obtained in the pixels P1 through P4 and P6 through P9 and outputs the generated image information. Here, since the portion of the stop S that corresponds to the optical region D5 is a light-blocking section, the light beam that has passed through the optical region D5 does not reach the pixel P5. Therefore, a pixel value is not obtained from the pixel P5.

In FIG. 14A, the light beam B2 passes through the optical region D2 in the optical element L1, and the light beam B8 passes through the optical region D8 in the optical element L1. The light beams B2 and B8 pass through the optical region L1, the stop S, the lens L2, and the optical element array K in this order, and then reach the imaging surface Ni of the image sensor N. Since FIG. 14A is a sectional view taken along the XIVA-XIVA line illustrated in FIG. 14B, the light beams that pass through the other optical regions are not illustrated.

In the present embodiment, the portion of the stop S that faces the optical region D5 blocks light, and thus crosstalk light can be suppressed. Hereinafter, this effect will be described.

Figure 15A:
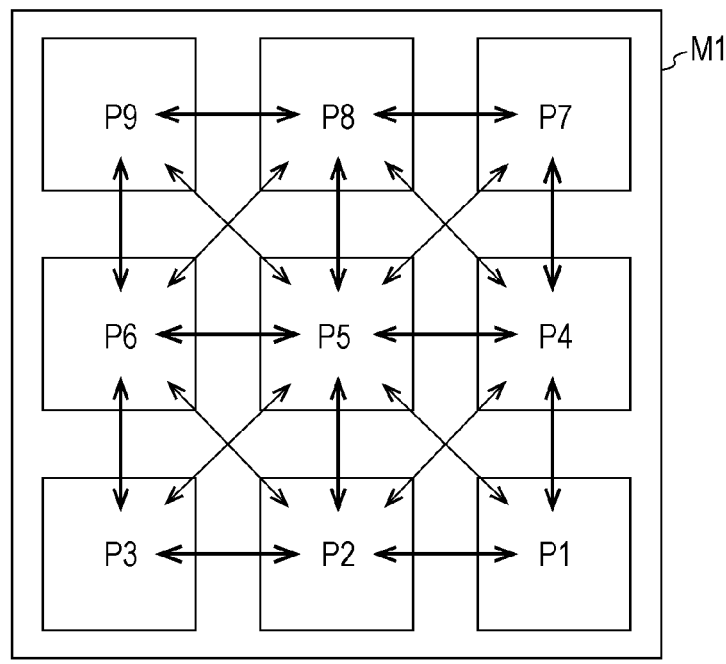
FIG. 15A schematically illustrates crosstalk light between adjacent pixels occurring in a case in which a light-blocking region is not provided.
Figure 15B:
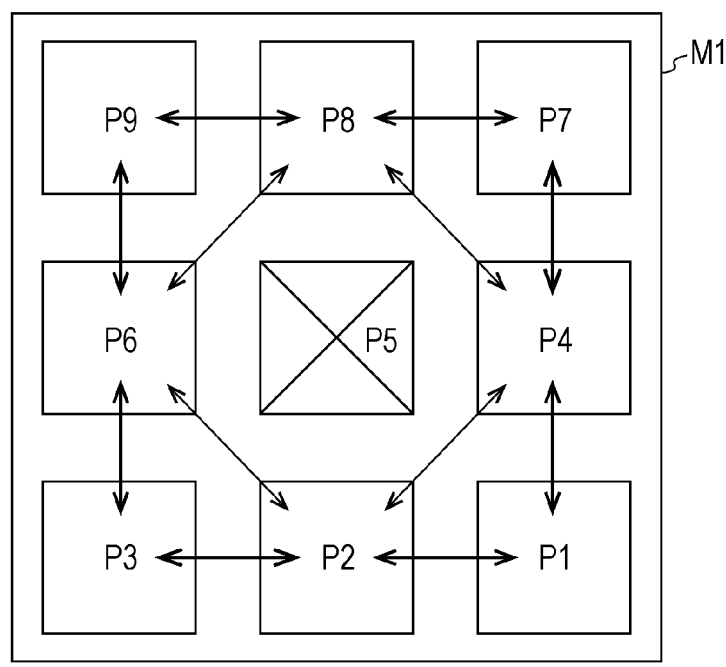
FIG. 15B schematically illustrates crosstalk light between adjacent pixels occurring in a case in which a light-blocking region is provided.

FIGS. 15A and 15B are illustrations for describing the effect of suppressing crosstalk light. First, an occurrence of crosstalk light in a case in which the optical region D5 transmits light in the fifth wavelength band and the portion of the stop S that faces the optical region D5 does not block light will be described. FIG. 15A illustrates crosstalk light between adjacent pixels in a case in which the portion of the stop S that faces the optical region D5 does not block light. Each of the arrows indicates a direction in which crosstalk light occurs. In the pixel P1, crosstalk light occurs with the three pixels P2, P4, and P5. In the pixel P2, crosstalk light occurs with the five pixels P1, P3, P4, P5, and P6. In the pixel P5, crosstalk light occurs with the eight pixels P1 through P4 and P6 through P9. In other pixels, crosstalk light occurs in a similar manner.

When such crosstalk light occurs, in addition to necessary spectral information, unnecessary spectral information is mixed in the information on the pixels. This situation prevents high-precision spectral information from being obtained.

FIG. 15B illustrates crosstalk light between adjacent pixels occurring in a case in which the portion of the stop S that faces the optical region D5 blocks light, as in the present embodiment. In the pixel P1, crosstalk light occurs with the two pixels P2 and P4. In the pixel P2, crosstalk light occurs with the four pixels P1, P3, P4, and P6. In other pixels, crosstalk light occurs in a similar manner. In the pixel P5, however, since the portion of the stop S that faces the optical region D5 blocks light, crosstalk light with another pixel does not occur.

In this manner, in the present embodiment, since the portion of the stop S that faces the optical region D5 blocks light, crosstalk light can be reduced. Therefore, as compared with a case in which the portion of the stop S that faces the optical region D5 does not block light, higher-precision spectral information can be obtained.

When the position of the stop S that faces the optical region D5 blocks light, the number of kinds of spectral images that can be obtained is reduced from nine to eight. However, in an intended use in which the number of necessary pieces of spectral information is eight or less, the introduction of a light-blocking section is effective in reducing crosstalk light.

In the present embodiment, the optical region D5 blocks light, and thus an occurrence of ghost light can also be suppressed. Hereinafter, this effect will be described.

Figure 16A:
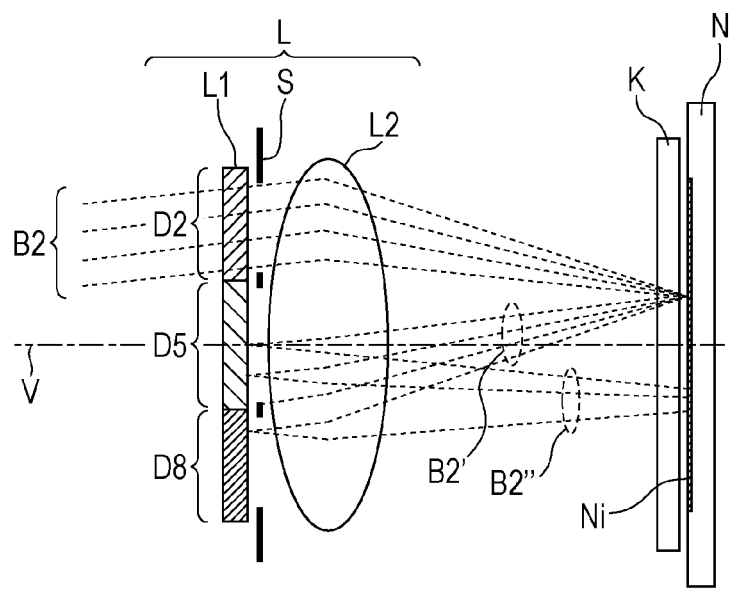
FIG. 16A is an illustration for describing ghost light occurring in a case in which a light-blocking region is not provided.
Figure 16B:
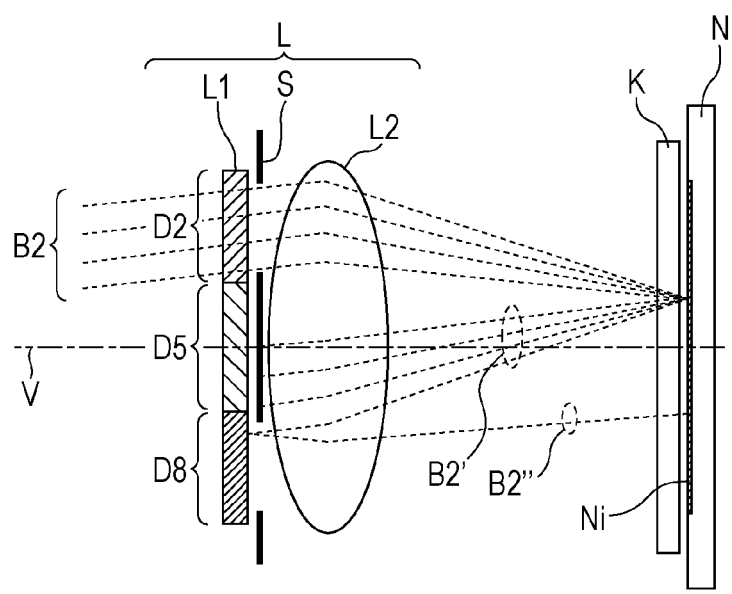
FIG. 16B is an illustration for describing ghost light occurring in a case in which a light-blocking region is provided.

FIGS. 16A and 16B are illustrations for describing the effect of suppressing ghost light. First, an occurrence of ghost light in a case in which the optical region D5 transmits light in the fifth wavelength band and the portion of the stop S that faces the optical region D5 does not block light will be described. FIG. 16A illustrates a principle in which ghost light occurs in a case in which the portion of the stop S that faces the optical region D5 does not block light. The following description is given while a focus is placed only on the light beam B2 that passes through the optical region D2. The light beam B2 passes through the optical region D2 in the optical region L1, the stop S, the lens L2, and the optical element array K in this order, and then reaches the imaging surface Ni of the image sensor N. Here, part of the light incident on the respective pixels is detected as an image signal, and another part of the light is specularly reflected to result in the reflected light B2'. The reflected light B2' passes through the optical element array K, the lens L2, and the stop S in this order and then reaches the optical regions D5 and D8 in the optical region L1. Here, in a case in which each optical region is formed by a dielectric multilayer film and the wavelength band of the light that passes through the optical region D2 is different from the wavelength bands of the light that passes through the optical regions D5 and D8, the reflected light B2" is generated. This is because most of the light at wavelengths outside the transmission wavelength band is reflected by a dielectric multilayer film, and most of the light incident on the optical regions D5 and D8 is thus specularly reflected. The reflected light B2" passes through the stop S, the lens L2, and the optical element array K in this order, and then reaches the imaging surface Ni of the image sensor N. The light that has reached the imaging surface through the above-described path forms a ghost image. Although a focus has been placed only on the optical region D2 in the preceding description, in reality, a ghost image is also generated by the light that passes through regions other than the optical region D2.

When such a ghost image is generated, in addition to necessary spectral information, unnecessary spectral information is mixed in the information on the pixels. This situation prevents high-precision spectral information from being obtained.

FIG. 16B illustrates a principle in which ghost light occurs in a case in which the portion of the stop S that faces the optical region D5 blocks light, as in the present embodiment. In FIG. 16B as well, a focus is placed only on the light beam B2 that passes through the optical region D2. Some of the light beam B2 is specularly reflected by the imaging surface Ni, and the reflected light B2' is generated, as in the case illustrated in FIG. 16A. The reflected light B2' passes through the optical element array K and the lens L2. Part of the reflected light B2' then reaches the light-blocking region of the stop S that faces the optical region D5 and is absorbed thereby, and another part of the reflected light B2' reaches the optical region D8. As in the case illustrated in FIG. 16A, most of the light incident on the optical region D8 is specularly reflected and the reflected light B2" is generated. The reflected light B2" reaches the imaging surface Ni of the image sensor N, as in the case illustrated in FIG. 16A. The light that has reached the imaging surface through the above-described path forms a ghost image.

When such a ghost image is generated, in addition to necessary spectral information, unnecessary spectral information is mixed in the information on the pixels. However, the amount of the unnecessary spectral information is reduced as compared with that in the case illustrated in FIG. 16A.

In this manner, according to the present embodiment, the stop S includes the light-blocking section at the position that faces the optical region D5, and thus a ghost image can be reduced. Therefore, as compared with a case in which the light-blocking section is not provided, higher-precision spectral information can be obtained.

Fifth Embodiment

Figure 17:
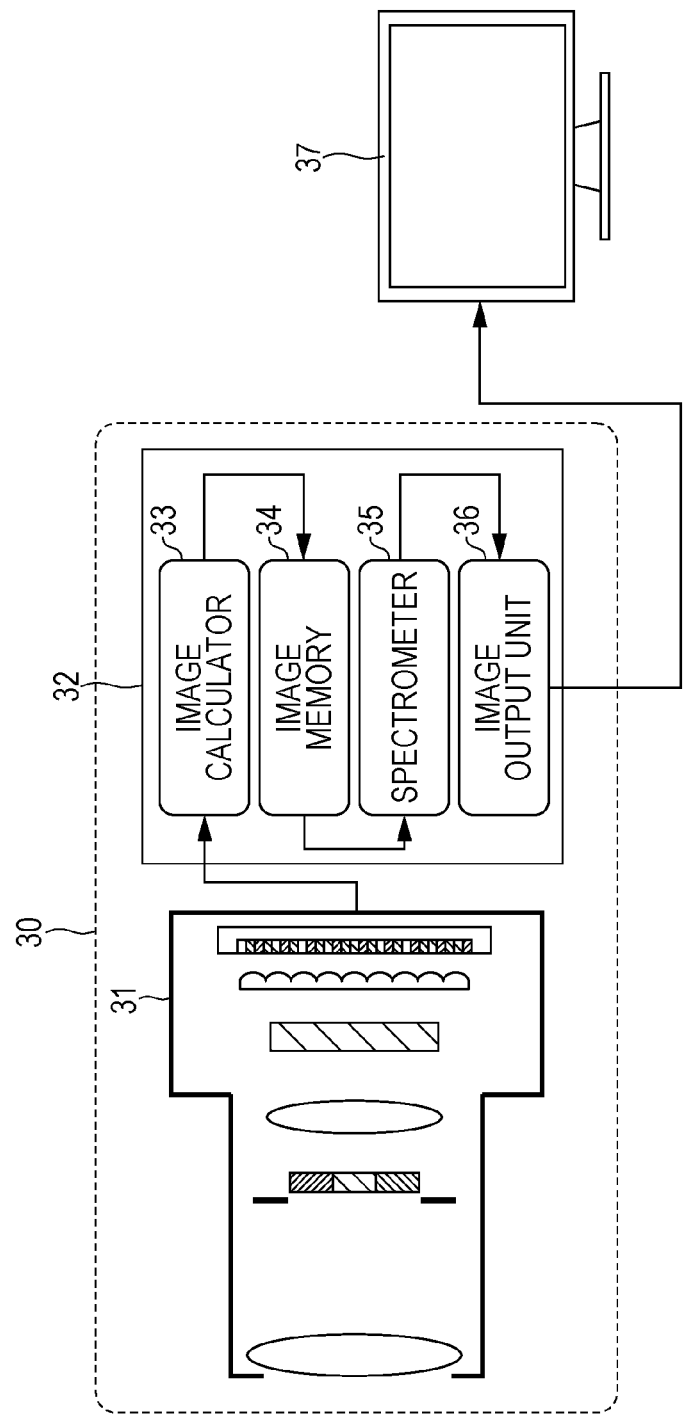
FIG. 17 is a schematic diagram illustrating an overall configuration of a spectral imaging system according to a fifth exemplary embodiment.

FIG. 17 is a schematic diagram illustrating an overall configuration of a spectral imaging system 30 that includes an imaging apparatus 31.

As illustrated in FIG. 17, the spectral imaging system 30 includes the imaging apparatus 31 and a signal processing device 32 that processes a signal outputted from the imaging apparatus 31. It is to be noted that the signal processor C described above corresponds to the signal processing device 32.

Any one of the imaging apparatuses 100A through 100D according to the present disclosure can be used as the imaging apparatus 31. Through this configuration, the signal processing device 32 can process a signal that is based on information on the light in which ghost light has been reduced. The signal processing device 32 processes a signal outputted from the imaging apparatus 31 and generates a video signal. A display 37 displays a two-dimensional spectral image on the basis of the video signal generated by the signal processing device 32. It is to be noted that the video signal, for example, is a luminance and color difference signal of each pixel.

The signal processing device 32 includes an image calculator 33, an image memory 34, a spectrometer 35, and an image output unit 36.

The image calculator 33, for example, carries out band-pass filter processing, calibrates the sensitivity of a micro-lens array, corrects crosstalk between pixels in an image sensor, and calculates a video signal. The image calculator 33 generates a two-dimensional image corresponding to the wavelengths of the band-pass filter.

The image memory 34 records the two-dimensional image corresponding to the wavelengths of the band-pass filter in the form of digital data. For example, the image memory 34 is constituted by a frame memory.

The spectrometer 35 reads out the two-dimensional image data from the image memory 34 and processes the two-dimensional image data. The spectrometer 35 generates two-dimensional image data of each wavelength range and analyzes the two-dimensional image data. The result of the analysis is represented in a graph.

The image output unit 36 converts the data represented in a graph into a video signal.

The signal processing device 32 may be constituted by a semiconductor element or the like. The signal processing device 32 may typically be implemented by an image signal processor (ISP). A computer program that implements the function of each component is installed in a memory inside the ISP. A processor in the ISP may successively execute the computer program, and thus the function of each component may be implemented. In this manner, the signal processing device 32 may be constituted only by hardware or may be implemented by a combination of hardware and software.

The display 37 displays a two-dimensional spectral image on the basis of a video signal.

In place of the signal processing device 32, an external device, such as a personal computer, that can directly connect to the imaging apparatus 31 may be used to process a signal outputted from the imaging apparatus 31.

In the present disclosure, all or a part of any of unit, device, element, member part or portion, or any of functional blocks in the block diagrams shown in FIGS. 11A, 14A, and 17 may be implemented as one or more of electronic circuits including, but not limited to, a semiconductor device, a semiconductor integrated circuit (IC) or a large-scale integration (LSI). The LSI or IC can be integrated into one chip, or also can be a combination of plural chips. For example, functional blocks other than a memory may be integrated into one chip. The name used here is LSI or IC, but it may also be called system LSI, very-large-scale integration (VLSI), or ultra-large-scale integration (ULSI) depending on the degree of integration. A field-programmable gate array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the unit, device, part or portion are implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

An imaging apparatus according to the present disclosure can be effectively used as an imaging apparatus for a food analyzer camera, a skin analyzer camera, an endoscope camera, a capsule endoscope, an in-vehicle camera, a surveillance camera, a digital still camera, a digital video camera, and so forth.

What is claimed is:
1. An imaging apparatus, comprising:
   a lens optical system that includes a lens and has optical regions, the optical regions including first through nth optical regions, n being an integer equal to or greater than 2;
   an image sensor on which light that has passed through the first through nth optical regions is incident, the image sensor including pixel groups and having an imaging surface that reflects a part of the light that has passed through the first through nth optical regions, the pixel groups each including n pixels of first through nth pixels;
an optical element array in which optical components are arrayed, the optical element array being disposed between the lens optical system and the image sensor, the optical components each guiding the light that has passed through the first through nth optical regions to the respective first through nth pixels in each of the pixel groups; and
an optical absorption member on which the part of the light is incident,
wherein an optical absorptance of the optical absorption member is substantially uniform across the entire wavelength bands of the light that has passed through the first through nth optical regions and is substantially uniform across the entire optical absorption member, and
the optical absorption member includes a plurality of openings that have a rotationally asymmetric shape with respect to a center axis of the lens optical system.

2. The imaging apparatus according to claim 1,
wherein the optical absorption member is disposed between the optical regions and the image sensor and absorbs at least first light in a first wavelength band and second light in a second wavelength band, the first light being capable of passing through the first optical region, the second light being capable of passing through the second optical region.

3. The imaging apparatus according to claim 2,
wherein at least one selected from the group of the first and second optical regions has optical characteristics of transmitting visible light, and
wherein the optical absorption member absorbs at least the visible light.

4. The imaging apparatus according to claim 2,
wherein the lens optical system further includes a stop, and
wherein the optical regions are disposed at the stop or in the vicinity of the stop.

5. The imaging apparatus according to claim 2,
wherein the first optical region differs from the second optical region in terms of at least one selected from the group of spectral transmittance characteristics and polarization characteristics.

6. The imaging apparatus according to claim 1,
wherein the optical absorptance of the optical absorption member is uniform across the entire wavelength bands of the light that has passed through the first through nth optical regions, or a relative error in the optical absorptance in the entire wavelength bands is within 10%, and
wherein the optical absorptance of the optical absorption member per unit area is uniform across the entire optical absorption member, or a relative error in the optical absorptance of the entire optical absorption member per unit area is within 10%.

7. The imaging apparatus according to claim 2, further comprising:
at least two narrow band-pass optical filters disposed in the optical regions, the at least two narrow band-pass optical filters differ in transmission wavelength bands thereof.

8. The imaging apparatus according to claim 2,
wherein the optical element array is a lenticular lens.

9. The imaging apparatus according to claim 2,
wherein the optical element array is a microlens array.

10. The imaging apparatus according to claim 2,
wherein the optical element array is integrated with the image sensor.

11. The imaging apparatus according to claim 2, further comprising:
a microlens provided between the optical element array and the image sensor, and
wherein the optical element array is integrated with the microlens and the image sensor.

12. The imaging apparatus according to claim 2,
wherein the optical absorption member is integrated with the image sensor.

13. The imaging apparatus according to claim 2,
wherein the optical absorption member is an absorptive neutral density filter, and a ratio of a quantity of emitted light that is emitted from the absorptive neutral density filter to a quantity of incident light that is incident on the absorptive neutral density filter is from 30% to 50% inclusive.

14. The imaging apparatus according to claim 2,
wherein the optical absorption member includes:
an absorptive linear polarizer that transmits vibrating light that vibrates in a direction of a polarization axis, and
a phase plate that converts linearly polarized light to circularly polarized light or to elliptically polarized light, and
wherein the absorptive linear polarizer is disposed in the optical absorption member toward a side of the optical regions, and the phase plate is disposed in the optical absorption member toward a side of the image sensor.

15. The imaging apparatus according to claim 14,
wherein the phase plate is a quarter-wave plate.

16. The imaging apparatus according to claim 14,
wherein the phase plate is an achromatic wave plate.

17. The imaging apparatus according to claim 2,
wherein the first optical region has first spectral transmittance characteristics of transmitting a first near-infrared ray in the first wavelength band, and the second optical region has second spectral transmittance characteristics of transmitting a second near-infrared ray in the second wavelength band, the second wavelength band being different from the first wavelength band, and
wherein the optical absorption member absorbs at least the first and second near-infrared rays.

18. The imaging apparatus according to claim 2,
wherein n is 9,
wherein, in each of the pixel groups, the first pixel, the second pixel, the third pixel, the fourth pixel, the fifth pixel, the sixth pixel, the seventh pixel, the eighth pixel, and the ninth pixel are arrayed in a 3×3 matrix,
wherein the pixel groups are repeated in a row direction and in a column direction in the image sensor,
wherein the optical element array is a microlens array that includes microlenses,
wherein each of the microlenses in the microlens array corresponds to one of the pixel groups, and
wherein the optical absorption member absorbs at least the first light, the second light, third light in a third wavelength band, fourth light in a fourth wavelength band, fifth light in a fifth wavelength band, sixth light in a sixth wavelength band, seventh light in a seventh wavelength band, eighth light in an eighth wavelength band, and ninth light in a ninth wavelength band, the third light being capable of passing through the third optical region, the fourth light being capable of passing through the fourth optical region, the fifth light being capable of passing through the fifth optical region, the sixth light being capable of passing through the sixth optical region, the seventh light being capable of passing through the seventh optical region, the eighth light being capable of passing through the eighth optical region, and the ninth light being capable of passing through the ninth optical region.

19. An imaging system, comprising:
an imaging apparatus including:
- a lens optical system that includes a lens and has optical regions, the optical regions including first through nth optical regions, n being an integer equal to or greater than 2,
- an image sensor on which light that has passed through the first through nth optical regions is incident, the image sensor including pixel groups and having an imaging surface that reflects a part of the light that has passed through the first through nth optical regions, the pixel groups each including n pixels of first through nth pixels,
- an optical element array in which optical components are arrayed, the optical element array being disposed between the lens optical system and the image sensor, the optical components each guiding the light that has passed through the first through nth optical regions to the respective first through nth pixels in each of the pixel groups, and
- an optical absorption member on which the part of the light is incident,
- an optical absorptance of the optical absorption member being substantially uniform across the entire wavelength bands of the light that has passed through the first through nth optical regions and being substantially uniform across the entire optical absorption member;
a signal processor adapted to process a pixel signal outputted from the imaging apparatus to generate image information; and
a display adapted to display an image corresponding to the image information,
wherein the optical absorption member includes a plurality of openings that have a rotationally asymmetric shape with respect to a center axis of the lens optical system.

20. The imaging apparatus according to claim 1, wherein the optical absorption member faces the first through nth optical regions, and
the optical absorptance of the optical absorption member is substantially uniform across an entire region that faces the first through nth optical regions.

21. The imaging apparatus according to claim 1, wherein the optical absorption member includes:
- a first region on which light that has passed through one of the first through nth optical regions and has reflected on the imaging surface is incident, and
- a second region on which light that has passed through another one of the first through nth optical regions and has reflected on the imaging surface is incident,
wherein the optical absorptance of the optical absorption member is substantially uniform across the first region and the second region.

22. The imaging system according to claim 19, wherein the optical absorption member faces the first through nth optical regions, and
the optical absorptance of the optical absorption member is substantially uniform across an entire region that faces the first through nth optical regions.

23. The imaging system according to claim 19, wherein the optical absorption member includes:
- a first region on which light that has passed through one of the first through nth optical regions and has reflected on the imaging surface is incident, and
- a second region on which light that has passed through another one of the first through nth optical regions and has reflected on the imaging surface is incident,
wherein the optical absorptance of the optical absorption member is substantially uniform across the first region and the second region.

* * * * *